(12) United States Patent
Busetti

(10) Patent No.: US 11,933,168 B2
(45) Date of Patent: Mar. 19, 2024

(54) GEOMECHANICAL MODELING OF STIMULATED ROCK VOLUME STRESS CONDITIONS AT MULTIPLE SCALES

(71) Applicant: Saudi Arabian Oil Company, Dhahran (SA)

(72) Inventor: Seth Busetti, Houston, TX (US)

(73) Assignee: Saudi Arabian Oil Company, Dhahran (SA)

( * ) Notice: Subject to any disclaimer, the term of this patent is extended or adjusted under 35 U.S.C. 154(b) by 150 days.

(21) Appl. No.: 17/095,236

(22) Filed: Nov. 11, 2020

(65) Prior Publication Data

US 2021/0140313 A1 May 13, 2021

Related U.S. Application Data

(60) Provisional application No. 62/933,798, filed on Nov. 11, 2019.

(51) Int. Cl.
*E21B 49/00* (2006.01)
*G01V 99/00* (2009.01)
(Continued)

(52) U.S. Cl.
CPC .......... *E21B 49/006* (2013.01); *G01V 99/005* (2013.01); *G06F 30/10* (2020.01);
(Continued)

(58) Field of Classification Search
CPC .... E21B 49/006; E21B 2200/20; E21B 33/00; G01V 99/005; G06F 30/10; G06F 30/00;
(Continued)

(56) References Cited

U.S. PATENT DOCUMENTS 7,953,587 B2 5/2011 Bratton et al.
8,437,999 B2 5/2013 Pita et al.
(Continued)

FOREIGN PATENT DOCUMENTS

EP 2975437 A1 1/2016

OTHER PUBLICATIONS

Tan Chengxuan et al. "An approach to the present-day three-dimensional (3D) stress field and its application in hydrocarbon migration and accumulation in the Zhangqiang depression, Liaohe field, China", Marine and Petroleum Geology, vol. 18, Issue 9 (Year: 2001).*

(Continued)

*Primary Examiner* — Rehana Perveen
*Assistant Examiner* — Troy A Maust
(74) *Attorney, Agent, or Firm* — Bracewell LLP; Constance G. Rhebergen; Brian H. Tompkins

(57) ABSTRACT

A geomechanically integrated model of stimulated rock volume (SRV) of subsurface formations in an area of interest for hydrocarbon production is formed. The methodology for forming the model takes into account geomechanical effects of interest and potential significance which occur over different dimensional scales. The methodology incorporates into the model fault perturbations which are present at a regional or seismic scale of from hundreds to thousands of meters, as well as layer stress occurring at a much smaller hydraulic fracture simulation scale of fractions of meters or meters. The methodology accommodates the differing representations of the subsurface grids used in previous models to represent these different geomechanical effects. Complex grid meshing and computer processing are avoided, improving computer operation and saving computer processing time.

14 Claims, 23 Drawing Sheets
(15 of 23 Drawing Sheet(s) Filed in Color)

(51) Int. Cl.
    *G06F 30/10*         (2020.01)
    *G06F 30/23*         (2020.01)
    *G06T 17/20*         (2006.01)

(52) U.S. Cl.
    CPC .............. *G06F 30/23* (2020.01); *G06T 17/20* (2013.01); *E21B 2200/20* (2020.05)

(58) Field of Classification Search
    CPC ........ G06F 30/23; G06F 30/20; G06F 30/367; G06F 30/398; G06T 17/20
    See application file for complete search history.

(56) References Cited

U.S. PATENT DOCUMENTS

| | | | |
|---|---|---|---|
| 8,619,500 | B2 | 12/2013 | Gray |
| 8,731,889 | B2 | 5/2014 | Du et al. |
| 9,733,388 | B2 | 8/2017 | Holl et al. |
| 10,712,472 | B2 | 7/2020 | Myers et al. |
| 2006/0129366 | A1* | 6/2006 | Shaw .................. G01V 1/30 703/10 |
| 2007/0118292 | A1 | 5/2007 | Moos |
| 2016/0018542 | A1 | 1/2016 | Maerten et al. |
| 2017/0051598 | A1 | 2/2017 | Quenes |
| 2017/0115420 | A1 | 4/2017 | Cazeneuve et al. |
| 2017/0145793 | A1 | 5/2017 | Quenes |
| 2017/0315266 | A1* | 11/2017 | Myers .................. G01V 99/005 |
| 2018/0094514 | A1 | 4/2018 | Leem et al. |
| 2018/0230784 | A1 | 8/2018 | Rodriguez Herrera et al. |

OTHER PUBLICATIONS

Broichhausen, H. et al.; "Elastic Disclocation Modelling and Coulomb Street Change Investigations" Search and Discovery Article #4167 (2015); pp. 1-20.

Dee, S.J. et al.; "Elastic Disclocation Modelling for Prediction of Small-Scale Fault and Fracture Network Characteristics" Geological Society, London, Special Publications, 2019, 270; pp. 139-155.

Healy, David et al.; "Fracture Prediction for the 1980 El Asnam, Algeria Earthquake via Elastic Disclocation Modeling" TECTONICS, vol. 23, TC6005, 2004; pp. 1-21.

Jonsson, Sigurjon et al.; "Fault Slip Distribution of the 1999 Mw 7.1 Hector Mine, California Earthquake, Estimated from Satellite Radar and GPS Measurements" Bulletin of the Seismological Society of America, May 2002, vol. 92, No. 4; pp. 1377-1389.

Meade, Brendan J.; "Algorithms for the Calculation of Exact Displacements, Strains, and Stresses for Triangular Dislocation Elements in a Uniform Elastic Half Space", Computers & Geosciences 33 (2007), pp. 1064-1075.

Richard, Pascal et al.; "Structural Evolution Model for the North Kuwait Carbonate Fields and its Implication for Fracture Characterisation and Modeling" IPTC 17620, International Petroleum Technology Conference, Qatar, Jan. 20-22, 2014, pp. 1-14.

Thomas, Andrew Lyle; "Poly 3D: A Three-dimensional, Polygonal Element, Displacement Discontinuity Boundary Element Computer Program with Applications to Fractures, Faults, and Cavities in the Earth's Crust" 1993, Stanford University; pp. 1-69.

Busetti, S. et al.; "Modeling Hydraulic Fracturing in Transitional Stress Regimes, Surat Basin, Australia" DFNE 18-625, American Rock Mechanics Association, 2018; pp. 1-9.

International Search Report and Written Opinion for International Application No. PCT/US2020/060046, report dated Feb. 26, 2021; pp. 1-14.

\* cited by examiner

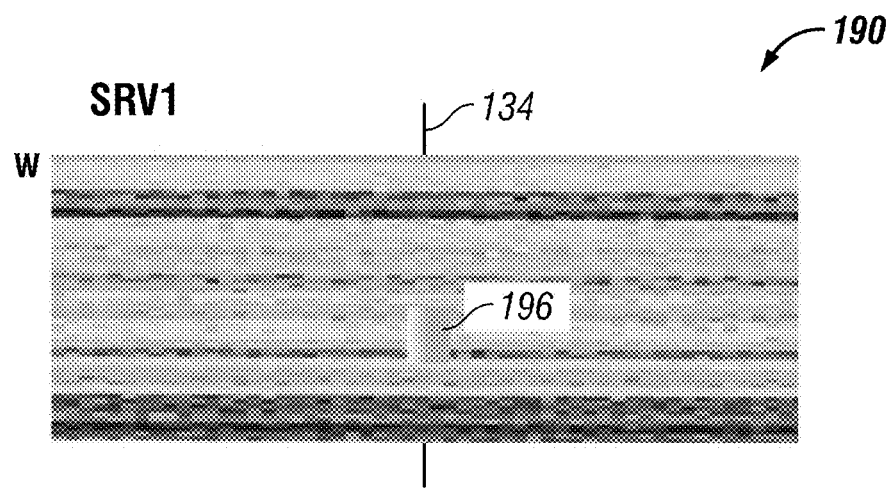
FIG. 11
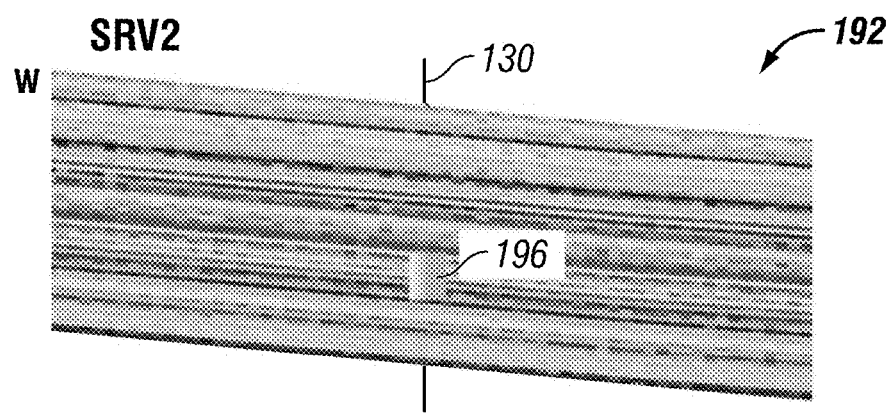
FIG. 12
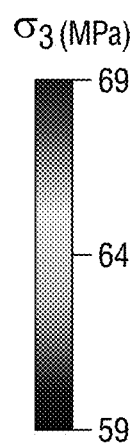
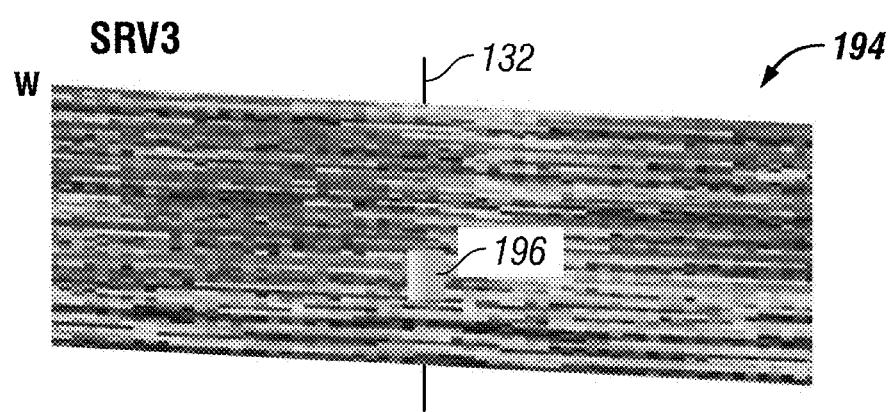
FIG. 13

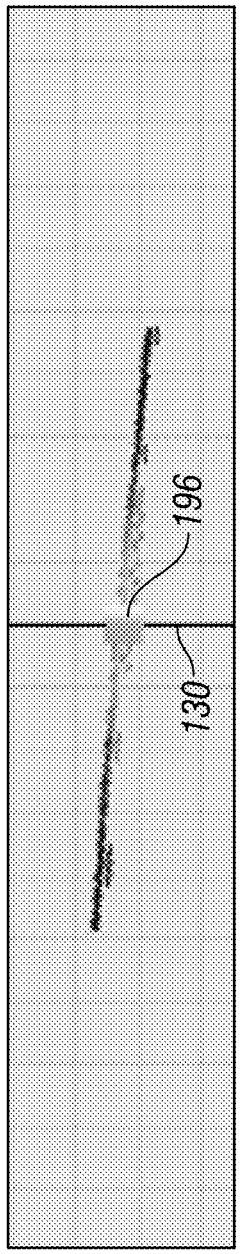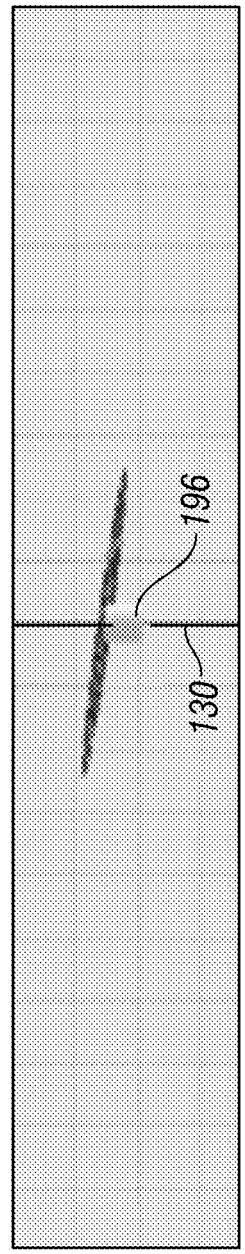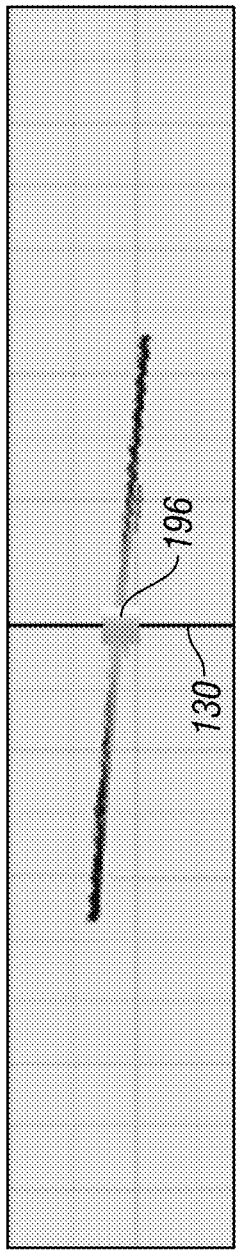

GEOMECHANICAL MODELING OF STIMULATED ROCK VOLUME STRESS CONDITIONS AT MULTIPLE SCALES

CROSS-REFERENCE TO RELATED APPLICATIONS

This application claims priority from U.S. Provisional Application No. 62/933,798 filed Nov. 19, 2019, and titled "GEOMECHANICAL MODELING OF STIMULATED ROCK VOLUME STRESS CONDITIONS AT MULTIPLE SCALES." For purposes of United States patent practice, this application incorporates the contents of the Provisional Application by reference in its entirety. The present disclosure relates to forming models of stimulated rock volume in subsurface regions of interest for planning and management of fracturing operations for hydrocarbon production from subsurface reservoirs.

BACKGROUND OF THE DISCLOSURE

1. Field of the Disclosure

The present disclosure relates to forming models of stimulated rock volume in subsurface regions of interest for planning and management of fracturing operations for hydrocarbon production from subsurface reservoirs.

2. Description of the Related Art

Planning and management of fracturing operations for hydrocarbon production from subsurface reservoirs involves well completion design, well spacing, and placement strategies. For these purposes, it has been important to have an accurate model of the subsurface rock formations and their characteristics to simulate production of hydrocarbon fluids. In conventional reservoir and tight gas sands, measures of rock fracture half-length and conductivity have been adequate for reservoir simulation. However, in unconventional or shale formations, more complex rock fracture network structures are present. Conventional measures such as rock fracture half-length and conductivity have not proven satisfactory for accurate reservoir simulation. Instead, a stimulated rock volume (or SRV) has been used as a model for planning and simulation of well and reservoir performance.

Because hydraulic fracturing focuses on wellbore operations, near wellbore stratigraphy, and properties derived from well logs, geomechanical models for the Stimulated Rock Volume (SRV) have for one or more reasons typically ignored stress effects from larger tectonic structures such as faults and folds.

Capturing these structural geomechanical effects of different origin and nature has been challenging due to differences in resolution. The scale of faults and folds may be at a seismic scale (100 m to 10 km) or at a much larger tectonic scale (10 km to 100 km). In contrast, near wellbore stratigraphy is at a typical scale of 0.1 m to 1 m. Thus, formation of the needed geomechanical models for planning of well fracturing was a technological problem. The tectonic effects and the near well stratigraphic models needed for accuracy in hydraulic fracturing operations were at different resolutions.

Representation of the two different structural geomechanical effects was also complicated because of different modeling representations used for them. The large scale structural geologic models containing accurate three-dimensional fault representations of discrete fault surfaces often required use of unstructured triangular or tetrahedral meshes. In contrast, stratigraphic models used to model hydraulic fracturing at a stimulated rock volume scale (tens of meters) were more easily formed if they were composed of grid elements which were hexahedral and continuous.

Detailed geomechanical models that contained accurate three-dimensional faults and layering were also time consuming to build. The detailed geomechanical models required specialized computer aided design (CAD) software, complicated meshing algorithms, and significantly increased computational expense.

Various techniques for fault interaction and stress perturbation for geocellular models have been documented in the literature. Techniques such as elastic perturbation to solve for stress in the vicinity of faults have been described. For example, some have used what are known as triangular dislocation methods. So far as is known, these methods have dealt with formation stress as a single local measure based on rock formation conditions present near a proposed injection well. This premise was accepted despite the physical fact that the actual stresses are composed of both background stress and perturbation stresses in the formations.

SUMMARY OF THE DISCLOSURE

Briefly, the present disclosure provides a new and improved method of forming a model of stress conditions in a stimulated reservoir volume in a region of interest of a subsurface reservoir formation for propagation of hydraulic fractures from an injection well in the region of interest of a subsurface reservoir for production of hydrocarbons from the subsurface reservoir. Mechanical properties and boundary conditions data of the subsurface reservoir are provided to a data processing system.

The provided mechanical properties and boundary conditions data are processed in the data processing system to form the model of stress conditions in the stimulated reservoir volume of the region of interest. The processing includes forming a background geomechanical model of the region of interest comprising a three dimensional grid of cells representing mechanical properties and boundary conditions over the extent of the region of interest in the subsurface reservoir formation, followed by determining stress tensors for the individual grid cells of the formed geocellular model of the region of interest.

A stress perturbation model of the region of interest is then formed by the processing. The stress perturbation model represents faults and folds contributing to a stress pattern for a candidate location of a stimulated reservoir volume in the region of interest. A measure of total stress at the candidate location is then determined for the stimulated reservoir volume in the region of interest, representing the effects of the formed stress perturbation model combined with the determined stress tensors.

A model of formation rock stress conditions around the injection well for candidate location for the stimulated rock volume is then determined. Three-dimensional stress conditions in a selected location for the stimulated rock volume model are then determined based on the formed model of formation rock stress conditions.

In one embodiment, a method of forming a model of stress conditions in a stimulated reservoir volume in a region of interest of a subsurface reservoir formation for propagation of hydraulic fractures from an injection well in the region of interest of a subsurface reservoir for production of hydrocarbons from the subsurface reservoir. The method includes providing mechanical properties and boundary conditions data of the subsurface reservoir to a data processing system and processing the provided mechanical properties and boundary conditions data in the data processing system to form the model of stress conditions in the stimulated reservoir volume of the region of interest. The processing includes forming a background geomechanical model of the region of interest, such that the background geomechanical model includes a three dimensional grid of cells representing mechanical properties and boundary conditions over the extent of the region of interest in the subsurface reservoir formation. The method also includes determining stress tensors for the individual grid cells of the formed background geomechanical model of the region of interest and forming a stress perturbation model of the region of interest, the stress perturbation model having a plurality of faults and a plurality of folds that contribute to a stress pattern for a candidate location of the stimulated reservoir volume in the region of interest. Additionally, the model includes determining, using the formed stress perturbation model and a stress grid of the formed background geomechanical model, a measure of total stress at the candidate location for the stimulated reservoir volume in the region of interest. The method further includes forming a model of stimulated rock volume around the injection well for candidate location for the stimulated rock volume and determining three-dimensional stress conditions in a selected location for the stimulated rock volume model using the measure of total stress.

In some embodiments, the method includes performing hydraulic fracturing of the stimulated reservoir volume for propagation of hydraulic fractures from the injection well for production of hydrocarbons from the subsurface reservoir. In some embodiments, the method includes forming an output image of the determined three-dimensional stress conditions in the formed stimulated rock volume model. In some embodiments, the method includes storing in the data processing system the determined three-dimensional stress conditions in the formed stimulated rock volume model. In some embodiments, the measure of total stress is a three-dimensional stress grid. In some embodiments, determining, using the formed stress perturbation model and the stress grid of the formed background geomechanical model, a measure of total stress at the candidate location for the stimulated reservoir volume in the region of interest includes using elastic superposition to combine perturbation stress from the formed stress perturbation model to the stress grid of the formed background geomechanical model. In some embodiments, the formed background geomechanical model is formed at a first geologic scale and the formed stress perturbation model is formed at a second geologic scale, such that the first geologic scale is different than the second geologic scale.

In another embodiment, a data storage device having stored in a non-transitory computer readable medium computer operable instructions for causing a data processing system to form a model of stress conditions in a stimulated reservoir volume in a region of interest of a subsurface reservoir formation for propagation of hydraulic fractures from an injection well in the region of interest of a subsurface reservoir for production of hydrocarbons from the subsurface reservoir is provided. The instructions stored in the data storage device cause the data processing system to perform operations that include forming a background geomechanical model of the region of interest, the background geomechanical model having a three dimensional grid of cells representing mechanical properties and boundary conditions of the subsurface reservoir over the extent of the region of interest in the subsurface reservoir formation. The operations also include determining stress tensors for the individual grid cells of the formed background geomechanical model of the region of interest and forming a stress perturbation model of the region of interest, the stress perturbation model comprising a plurality of faults and a plurality of folds that contribute to a stress pattern for a candidate location of the stimulated reservoir volume in the region of interest. Additionally, the operations include determining, using the formed stress perturbation model and a stress grid of the formed background geomechanical model, a measure of total stress at the candidate location for the stimulated reservoir volume in the region of interest. The operations further include forming a model of stimulated rock volume around the injection well for candidate location for the stimulated rock volume and determining three-dimensional stress conditions in a selected location for the stimulated rock volume model using the measure of total stress.

In some embodiments, the operations include forming an output image of the determined three-dimensional stress conditions in the formed stimulated rock volume model. In some embodiments, the method includes storing in the data processing system the determined three-dimensional stress conditions in the formed stimulated rock volume model. In some embodiments, the measure of total stress is a three-dimensional stress grid. In some embodiments, determining, using the formed stress perturbation model and the stress grid of the formed background geomechanical model, a measure of total stress at the candidate location for the stimulated reservoir volume in the region of interest includes using elastic superposition to combine perturbation stress from the formed stress perturbation model to the stress grid of the formed background geomechanical model. In some embodiments, the formed background geomechanical model is formed at a first geologic scale and the formed stress perturbation model is formed at a second geologic scale, such that the first geologic scale is different than the second geologic scale.

In another embodiment, a data processing system for forming a model of stress conditions in a stimulated reservoir volume in a region of interest of a subsurface reservoir formation for propagation of hydraulic fractures from an injection well in the region of interest of a subsurface reservoir for production of hydrocarbons from the subsurface reservoir is provided. The data processing system includes a processor and a non-transitory memory having program code stored thereon. The program code includes instructions that cause the processor to perform operations that include forming a background geomechanical model of the region of interest, the background geomechanical model having a three dimensional grid of cells representing mechanical properties and boundary conditions of the subsurface reservoir over the extent of the region of interest in the subsurface reservoir formation. The operations also include determining stress tensors for the individual grid cells of the formed background geomechanical model of the region of interest and forming a stress perturbation model of the region of interest, the stress perturbation model comprising a plurality of faults and a plurality of folds that contribute to a stress pattern for a candidate location of the stimulated reservoir volume in the region of interest. Additionally, the operations include determining, using the formed stress perturbation model and a stress grid of the formed background geomechanical model, a measure of total stress at the candidate location for the stimulated reservoir volume in the region of interest. The operations further include forming a model of stimulated rock volume around the injection well for candidate location for the stimulated rock volume and determining three-dimensional stress conditions in a selected location for the stimulated rock volume model using the measure of total stress.

In some embodiments, the operations include forming an output image of the determined three-dimensional stress conditions in the formed stimulated rock volume model. In some embodiments, the method includes storing in the data processing system the determined three-dimensional stress conditions in the formed stimulated rock volume model. In some embodiments, the measure of total stress is a three-dimensional stress grid. In some embodiments, determining, using the formed stress perturbation model and the stress grid of the formed background geomechanical model, a measure of total stress at the candidate location for the stimulated reservoir volume in the region of interest includes using elastic superposition to combine perturbation stress from the formed stress perturbation model to the stress grid of the formed background geomechanical model. In some embodiments, the formed background geomechanical model is formed at a first geologic scale and the formed stress perturbation model is formed at a second geologic scale, such that the first geologic scale is different than the second geologic scale.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 11 is a vertical-cross sectional display of an example model of stress distribution in one of the stimulated reservoir volumes of the region of interest of FIG. 10.

FIGS. 12 and 13 are vertical cross-sectional displays of further example models of stress distribution in other stimulated reservoir volumes of the region of interest of FIG. 1.

FIGS. 18A-D, 19A-D, and 20A-D are computerized vertical cross-sectional displays of simulated hydraulic fracture morphologies for example stimulated reservoir volumes according to the present disclosure.

DETAILED DESCRIPTION

Introduction

Figure 1:
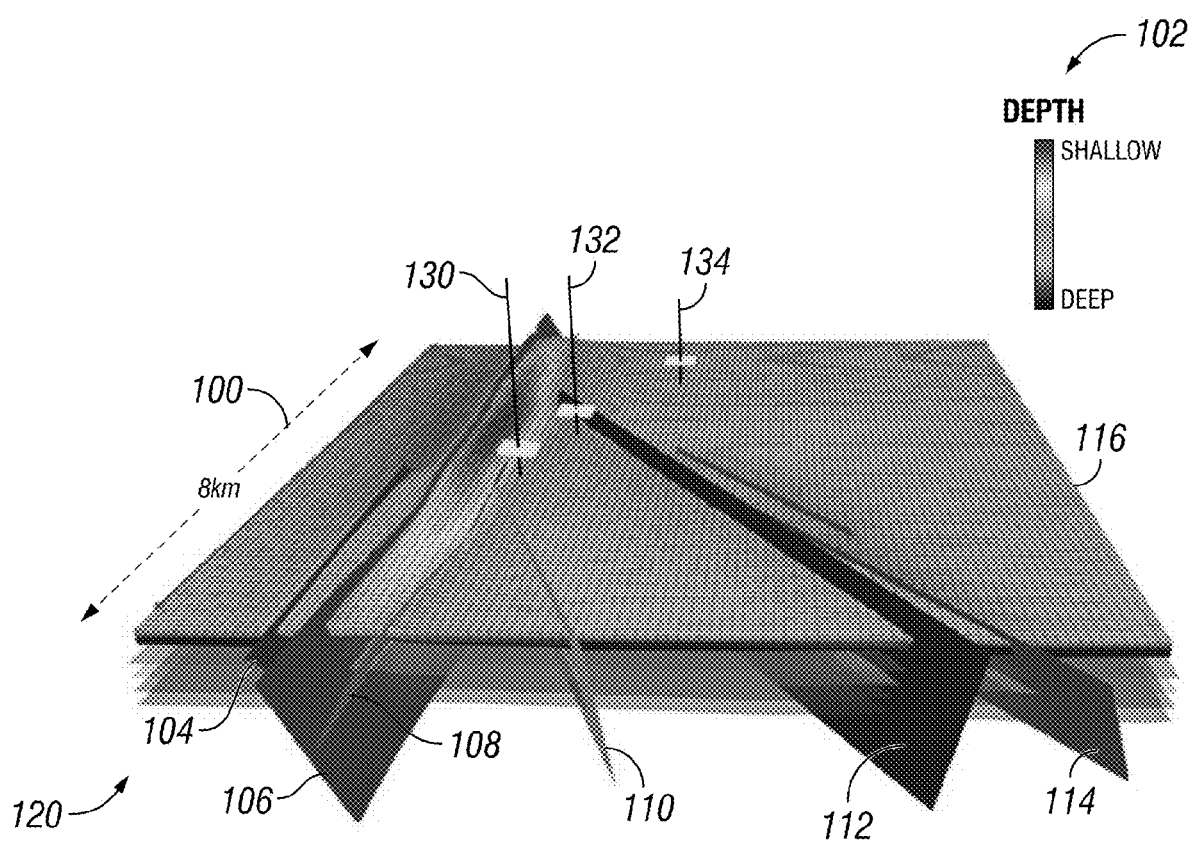
FIG. 1 is a perspective view of a computerized 3-dimensional seismic-scale structural model of subsurface rock formations in a region of interest for hydrocarbon production according to the present disclosure.
Figure 2:
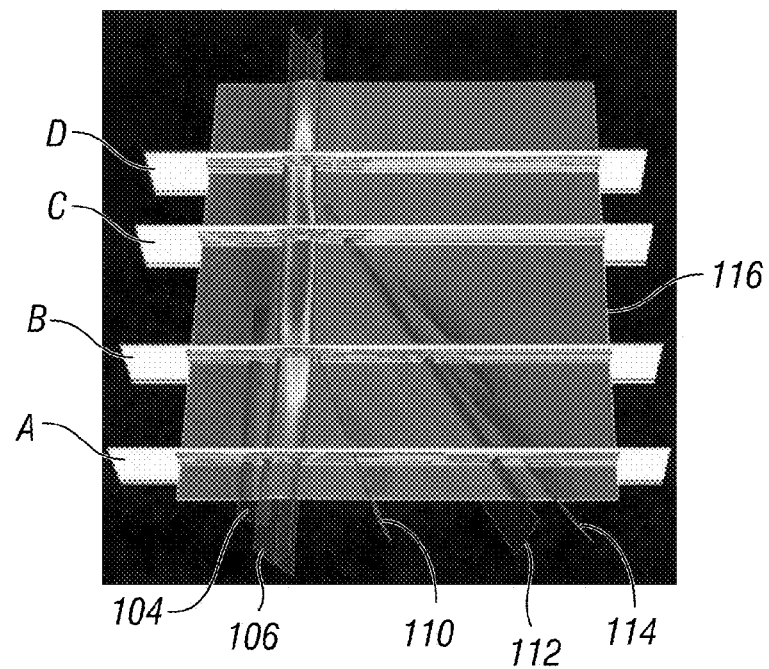
FIG. 2 is another perspective view of the computerized 3-dimensional seismic-scale structural model of FIG. 1.
Figure 2A:
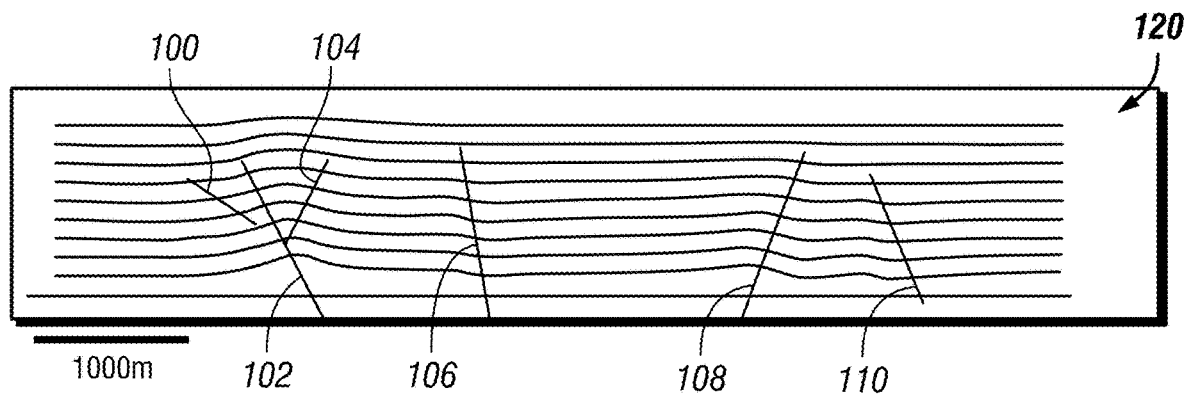
FIGS. 2A, 2B, 2C, and 2D are vertical cross-sectional views of geological faults and horizons in the structural model of FIG. 2.
Figure 2B:
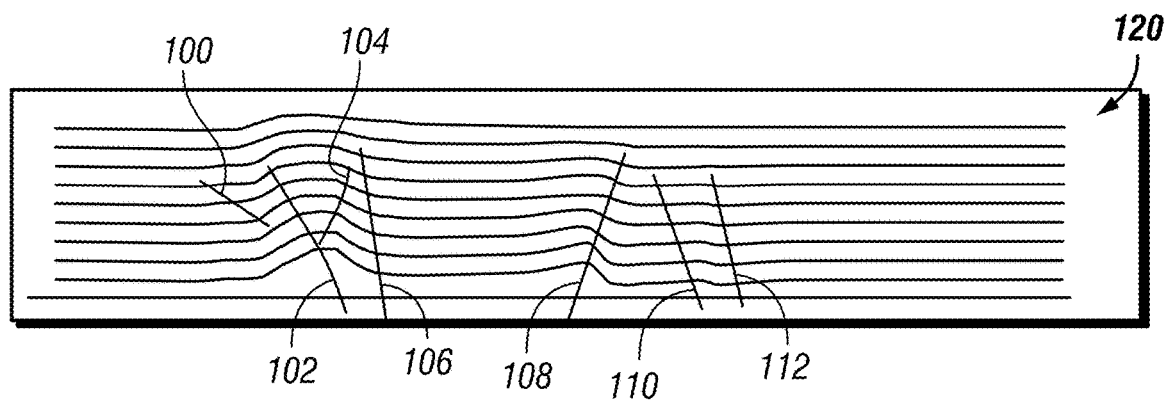
Figure 2C:
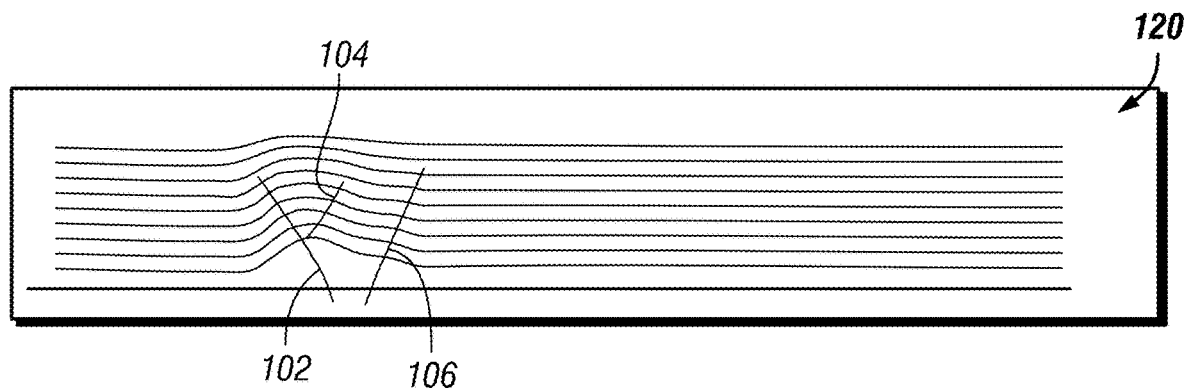
Figure 2D:
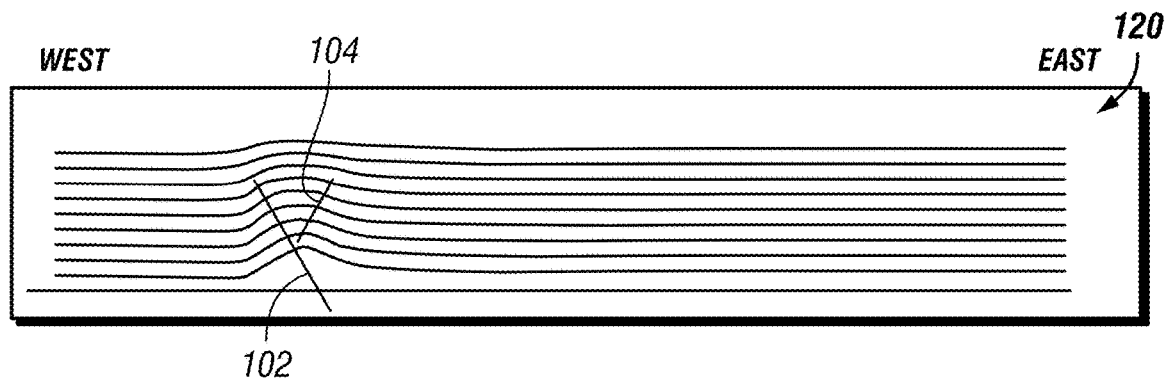

In hydraulic fracturing for increased hydrocarbon production, it is important to plan optimal location of an injection well for introducing pressurized fluids which cause increased formation fracturing and consequent increased flow of the hydrocarbon fluids. Planning the location of the injection well is based on knowledge of formation stress state, mechanical layering, and well operational parameters as inputs for simulations of fracture propagation operations.

In formations where hydraulic fracturing is to be performed, complex rock fracture network structures are present. Conventional measures such as rock fracture half-length and conductivity have not proven satisfactory for accurate reservoir simulation. Instead, a stimulated rock volume (or SRV) has been used as a model for planning and simulation of well and reservoir performance. Geomechanical behavior in the stimulated rock volume (SRV) during the fracturing operation requires consideration of local interaction with geological structures. This interaction may occur for one or more of several physical conditions.

These physical conditions may take the form of reactivation of faults, fracture corridors, and bedding planes leading to lost injection fluids, induced seismicity, casing shear, and cross-well communication. Other physical conditions may also include local stress perturbations caused by proximity to faults and folds and leading to sub-optimal hydraulic fracture orientations and proppant screen-out. Further physical conditions may be local stress amplification in beds, which can result in fracture barriers or pinch-points.

The present disclosure provides, as will be described, a new and improved geomechanical modeling methodology for fully integrating the stress and strain fields associated with three-dimensional faults and folds at their native resolution (seismic to tectonic scale) with stress and strain fields associated with local mechanical stratigraphic architecture (wellbore to hydraulic fracture scale), while also preserving appropriate geomechanical mesh resolution at each scale.

The present disclosure is integrated into a practical application. The present disclosure solves a technological problem in that it allows optimized hydraulic fracturing of stimulated reservoir volumes in subsurface formations. The present disclosure permits planning of hydraulic fracturing operations, taking into consideration both near wellbore formation stress conditions and regional tectonic effects in determining locations for conducting hydraulic fracture operations within a stimulated reservoir volume.

The present disclosure thus provides a geologically conditioned stress model for the stimulated rock volume that incorporates stress perturbations or changes in magnitude and rotation, due to geologic structures that affect hydraulic fracture orientation and propagation effectiveness. The models formed according to the present disclosure also indicate stress conditions which contribute to local layering contrasts and bedding stress amplification due to well log (namely sonic, gamma ray, or resistivity log) scale layer properties.

The local stratigraphic effects are important to predict upward or downward hydraulic fracture growth, as well as indicate possible hydraulic fracture barriers ("frac barriers") which are known to control fracture containment. The models according to the present disclosure thus represent both structural geologic geomechanical effects and greater resolution stratigraphic layering geomechanical effects. The present disclosure thus allows for more accurate hydraulic fracture simulation and a more accurate prediction of the stimulated rock volume.

The present disclosure provides a new and improved methodology to form a resultant three-dimensional geomechanical model for a stimulated rock volume (SRV) based on superposition of elastic strains or stresses from multiple geomechanical models at different geologic scales. This solves a technological problems since it retains geomechanical solution accuracy but is significantly easier to model than existing approaches. The present disclosure also involves less computational power than complex geometrically constrained models that explicitly mesh and co-reconcile each geometric feature.

For example, previous techniques built a single "all encompassing" 3D finite element model with heterogeneous properties. Multiple discrete faults were represented as contact surfaces having meshes which had to be seamlessly reconciled with numerous folded or fault-offset thin beds.

In contrast, the present disclosure avoids many of these tedious modeling constraints. The present disclosure improves computer operations by reducing model-building time and circumventing instabilities associated with complex finite element mesh geometries. The present disclosure improves computer operations by reducing demand on computational resources, and offers increased flexibility for modeling multiple realizations and scenario uncertainty testing.

The SRV geomechanical model takes the form of a block or cube shaped geocellular or gridded volume model with specific architectural qualities determined by the seismic interpretation of layers, well log interpretation of layers, or both, and the model dimensions of height, width, and length determined by the hydraulic fracture dimensions. SRV model height must be greater than the tallest hydraulic fracture, plus there must be sufficient data regarding upper and lower bounding stratigraphy to enclose upward and downward hydraulic fracture propagation.

The SRV model height must also extend far enough to reduce boundary or edge effects in a numerical stress simulation. A typical SRV model height for a model with one or two stimulation depth-zones is 25-100 m. The SRV model width depends on the number of hydraulic fractures, the fracture geometric complexity, and whether fractures are generated from a vertical well (narrower SRV model) or distributed along a horizontal well (wider SRV model).

A typical SRV model width for a vertical well is one to four times the SRV height. If the SRV model is based on a horizontal well, the width could often be greater than 3,000 m. For example, 10,000 ft. horizontal wells are common in the Permian Basin in the United States. The SRV model length should ideally enclose all hydraulic fractures so that the tips of the fractures do not lie outside of the model. Fracture length is variable and can range from tens of meters to over 1 km.

Processing Workflow

Figure 3:
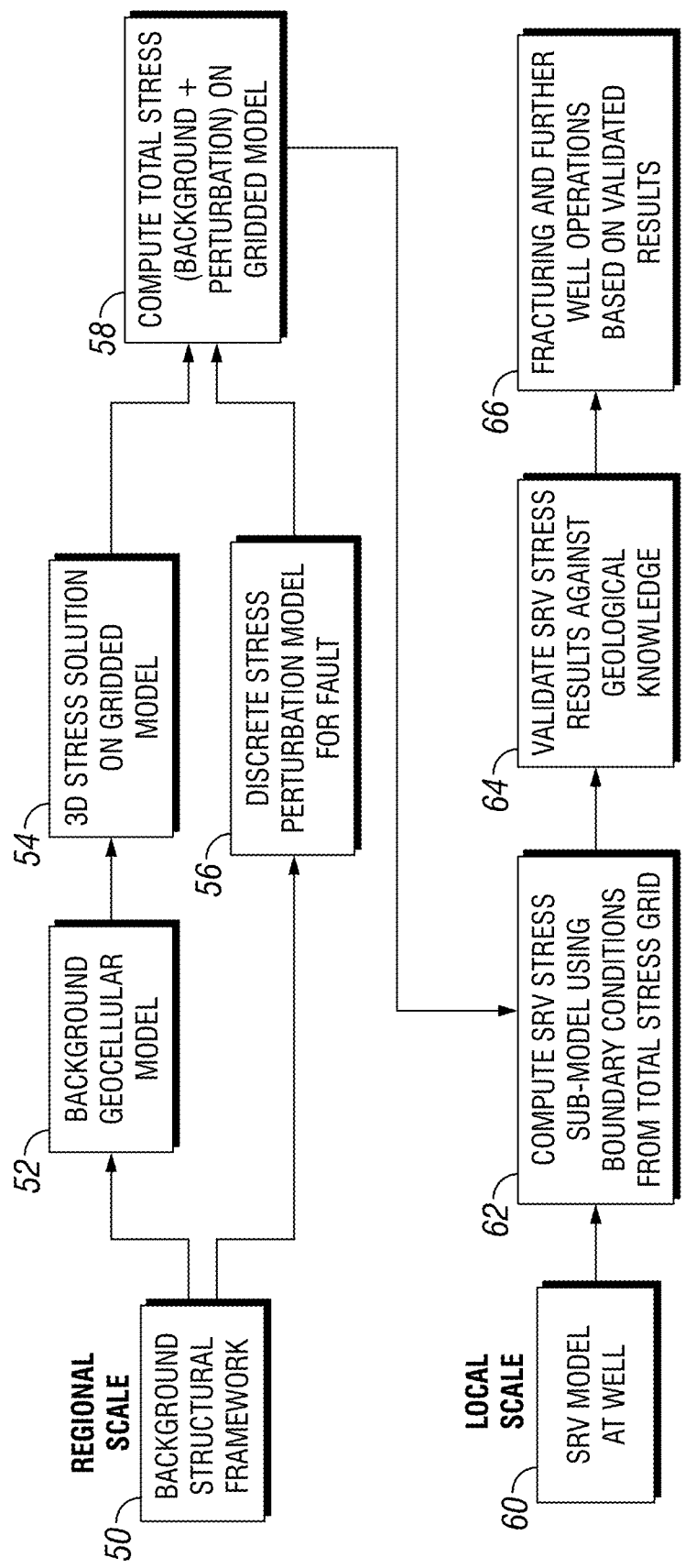
FIG. 3 is a functional block diagram of a flow chart of data processing steps according to the present disclosure for geomechanical modeling of stimulated rock volume stress conditions at multiple scales.

Turning to FIG. 3, a flow chart F displays a set of processor steps performed according to the methodology of the present disclosure in conjunction with a data processing system D (FIG. 25) for geomechanical modeling of stimulated rock volume stress conditions at multiple scales according to the present disclosure. The flowchart F indicates the operating methodology of geomechanical modeling of stimulated rock volume stress conditions including a computer processing sequence and computations takings place in the data processing system D for such geomechanical modeling.

As indicated at step 50, the methodology of the present disclosure is based on input reservoir data stored in the data processing system D. The input reservoir data, as will be described, includes an input computerized structural model representing the geologic formations of a region of interest and information regarding the subsurface geological strata in the region of interest. As an example, a conceptual structural model is utilized based on 3D block model diagrams for Sabriyah Ridge, Kuwait (Structural Evolution Model for the Kuwait Carbonate Fields and its Implication for Fracture Characterization and Modeling, Richard et al., IPTC 17620, International Petroleum Technology Conference, 2014). The background structural model that includes regional scale horizons and faults, known as the structural framework M (FIG. 1).

3D Structural Framework

As indicated at 100 in FIG. 1, the relative scale of the model is some approximately 8 km in lateral extent. Reservoir depth is indicated by an accompanying quantifying color key or scale 102.

As indicated in FIG. 1 at 104, 106, 108, 110, 112, 114 and 116 during step 52 fault surfaces are manually drawn in 3D interpretation software, but could also be imported from an existing 3D seismic interpretation and introduced into the model M by the data processing system D as discrete fracture network (DFN) objects using the FracMan® software available from Golder Associates. These fault surfaces so introduced are approximately to the scale of the model M.

Horizons are generated by iterative kinematic/mechanical forward modeling using elastic dislocation techniques using the Aramco Services Company proprietary MATLAB code FAST. Horizons can also be imported from an existing 3D seismic interpretation, digital elevation maps, or subsurface depth maps based on well tops. It should be understood that there are several available techniques which can be used for this purpose. These include, for example, Petrel available from Schlumberger Limited, DSG available from Landmark Solutions, FracMan® available from Golder Associates, T7 available from Badleys Geoscience, MOVE available from Midland Valley Exploration Ltd., and GoCAD/SKUA available from Emerson E&P Software.

The geomechanical model M for the SRV is composed of features as indicated at 120 known to be present in the area of interest. These features include the following geo-mechanical and geological data:

(a) Stratigraphic layers, which can be simplified as planar horizontal features or rendered with three-dimensional accuracy using a combination of interpreted horizons from 2D or 3D seismic and horizon picks ("well tops") as interpreted on well logs;

(b) One or more perforated wells used such as shown at 130, 132, and 134 to propagate hydraulic fractures. The wells can vertical, deviated, or horizontal in the zone of stimulation. Layering and mechanical properties in the stimulated well(s) should drive or at least conform to those of the three-dimensional grid or geocellular model;

(c) Mechanical properties, such as Young's modulus and Poisson's ratio, which can be heterogeneous or continuous, though typically mechanical properties are distributed layer-by-layer as a probability density function. For example, mechanical layering and associated properties can be derived from sonic logs, rock core, for example giving properties for limestone or marl or shale units at a scale of 1 cm to 1 m. A basic geomechanical property set may for example be composed of Young's modulus, Poisson's ratio, and rock density. However, more complex constitutive models may be invoked that incorporate porosity, bulk modulus, shear modulus, rock strength, tensile and compressive yield surface attributes, and other suitable geomechanical properties;

(d) Structural discontinuities, in particular any geomechanically relevant faults, natural fractures, or bedding planes which could cause in situ stress perturbations or react during hydraulic stimulation, whether mechanically (slip, dilation, or other strain accommodation) or hydraulically (fluid-leak off causing pressure or volume loss). Discontinuities can be explicitly modeled (namely, a discrete fracture network model, DFN, or through rigorous three-dimensional geometric modeling and meshing) or using mathematical equivalencies (namely, "smeared crack" or other continuum mechanics formulations); and (e) Three-dimensional state of stress, fully defined in terms of the Cauchy stress tensor:

$$\sigma_{ij} = \begin{bmatrix} \sigma_{xx} & \sigma_{xy} & \sigma_{xz} \\ \sigma_{yx} & \sigma_{yy} & \sigma_{yz} \\ \sigma_{zx} & \sigma_{zy} & \sigma_{zz} \end{bmatrix}$$

For more idealized configurations, the stresses could be simplified using axis-aligned Andersonian principle stress nomenclature: $S_v$, $S_{Hmax}$, $S_{hmin}$, corresponding to overburden, maximum horizontal stress, and minimum horizontal stress, respectively.

3D Background Stress Model

The gridded volumetric or geocellular background geomechanical model M at the regional scale thus includes the relevant mechanical properties and boundary conditions of the region of interest. The background geo-mechanical model M is then processed during step 54 to form a 3D Background Stress Model. A suitable 3D stress solver during step 54 determines the magnitude of stress tensors over the extent of cells of the model M. A suitable 3D finite element solution such as FracMan® is used to compute background stress conditions in the vertical and horizontal planes under gravitational loading and far-field boundary constraints (applied linear stress gradient), but without the effects of proximity to faults.

A basic estimation of stress can be computed by extrapolating stress laterally in the model M away from a 1D wellbore with data obtained from well logs. The logs may be a sonic log for dynamic Young's modulus and Poisson's ratio, v, and a density log. In the 1D wellbore approach overburden stress is computed ($S_v$=density*gravitational acceleration*depth) and used to compute a solution for minimum horizontal stress ($S_{hmin}$), also known as fracture gradient. For example, Eaton's (1969) equation for gravitational loading can be invoked: $S_{hmin}=(v/(1-v)*(Sv-Pp)+Pp)$.

There are a number of available commercial wellbore stress tools for this purpose, including Petrel available from Schlumberger Limited, Techlog also available from GMI Schlumberger Limited, DSG available from Landmark Solutions, also available from Landmark Solutions and Geolog available from Emerson E&P Software.

Figure 4:
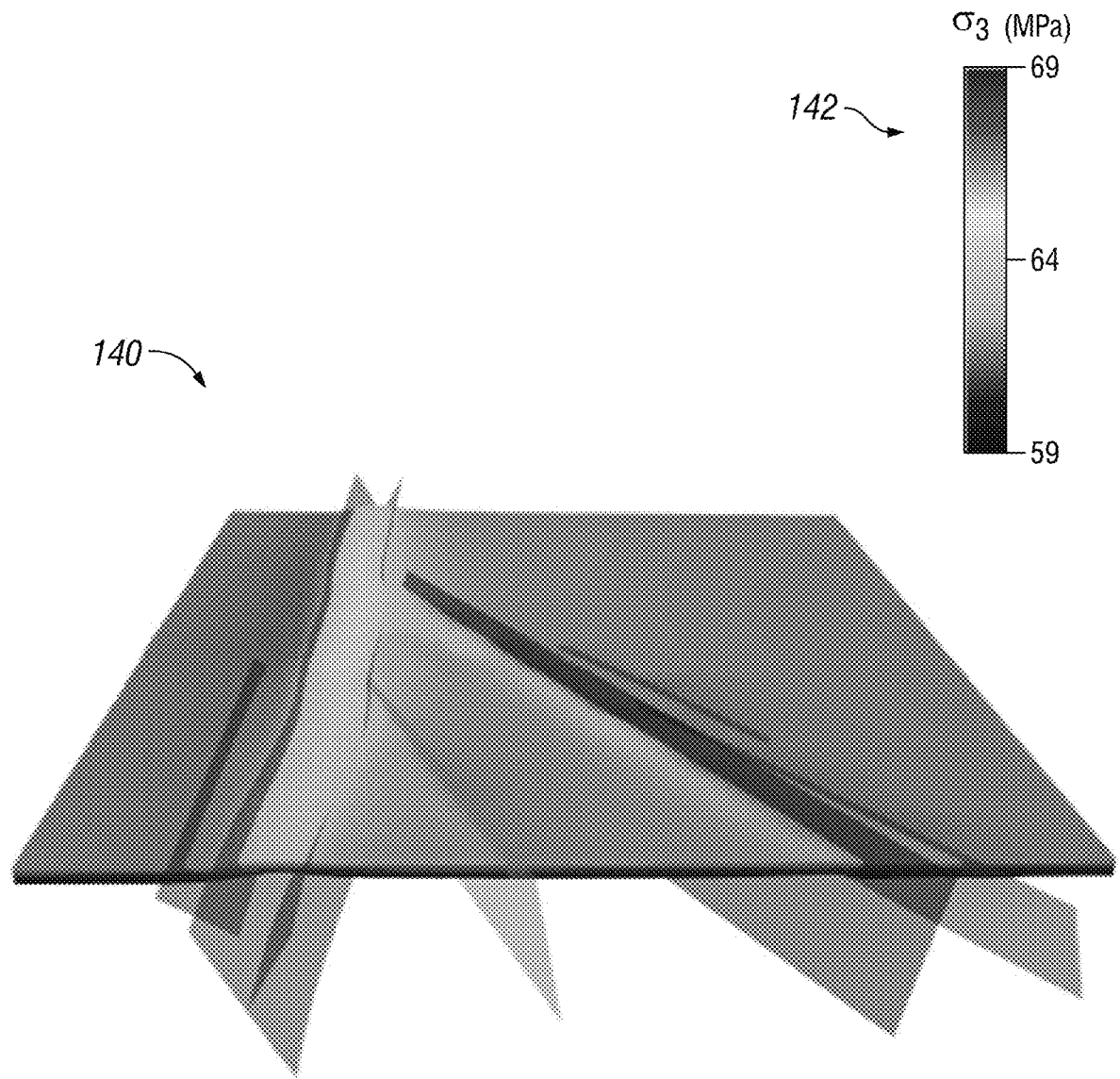
FIG. 4 is a perspective view of a computerized 3-dimensional background stress model of the region of interest shown in the model of FIG. 1.

More accurate estimates of three-dimensional stress can be computed throughout the 3D property grid using a full Cauchy stress tensor and finite element solution techniques, as demonstrated in FIG. 4. FIG. 4 is an image 140 of a 3-D display of minimum horizontal stress $\sigma_3$ in the gridded background geomechanical model M. A quantifying color key 142 indicates values of background stress $\sigma_3$ in Megapascals.

Figure 5:
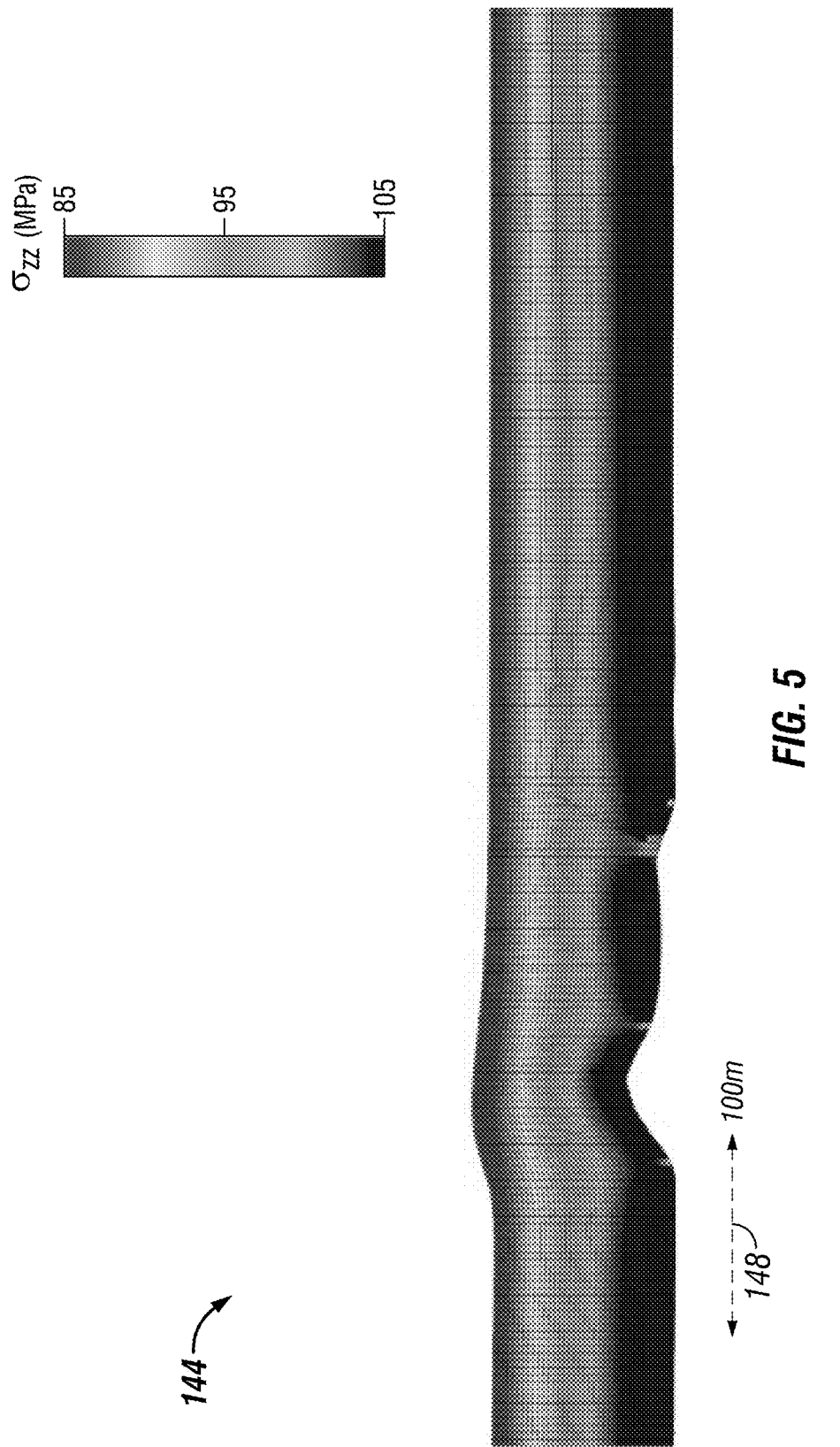
FIG. 5 is vertical cross-sectional view of computerized geological faults and horizons in the structural model of FIG. 4.

FIG. 5 is a two dimensional display 144 of stress $\sigma_{zz}$ in a vertical direction along an east-west vertical plane in a portion of the model 140 of FIG. 4. The display 144 is at a scale as indicated at arrow 146 of the faults and folds that contribute to the overall stress pattern of the background stress grid 140 (FIG. 4).

There are a number of commercially available finite element modeling tools which can be used during step 54 to form the 3-D background stress model. These include ABAQUS available from Dassault Systemes, ANSYS available from Ansys, Inc., ELFEN available from Rockfield Global Technologies America LLC, VISAGE available from Schlumberger Limited, FLAC3D available from Itasca Consulting Group, Inc., COMSOL available from Comsol, Inc., and FracMan® from Golder Associates.

3D Stress Perturbation (Elastic Dislocation)

Figure 6:
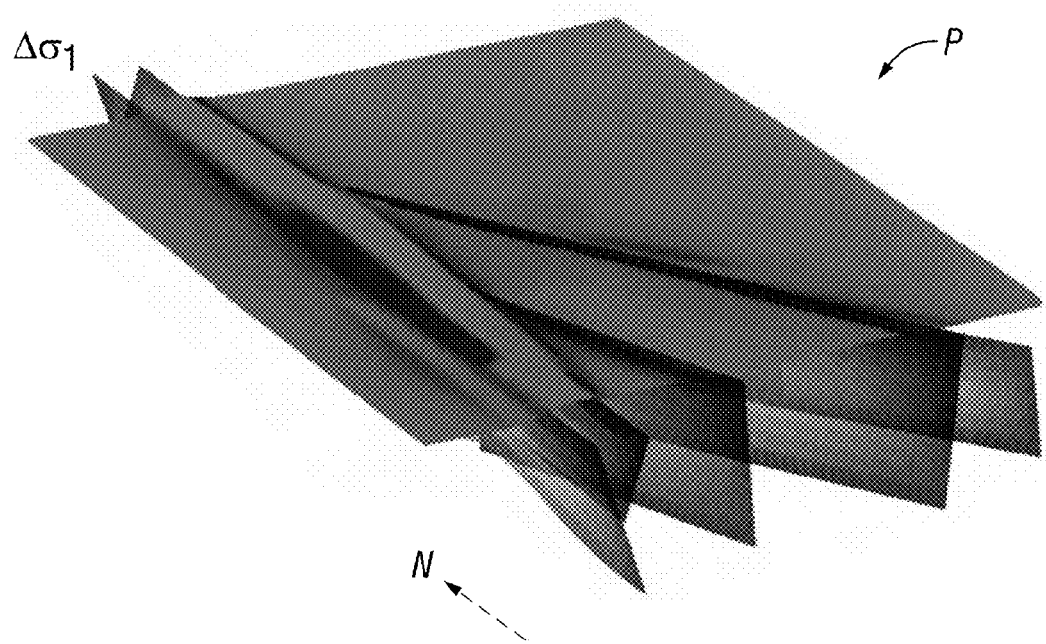
FIG. 6 is a view of a computerized tectonic scale 3-dimensional stress perturbation model formed according to the present disclosure for the region of interest of FIG. 1.

The workflow methodology according to the present disclosure includes step 56 during which a computerized discrete stress perturbation model P (FIG. 6). As shown in FIG. 6, the stress perturbation model P is a tectonic scale model into which 3-D stress perturbations are introduced during step 56 (FIG. 3). The 3D stress perturbations due to geological structures are during step 56 solved using elastic dislocation (ED) methods. Each fault is assigned a dislocation, which is a combination of dip slip and strike slip components, and also dilation/contraction. Component dislocation vectors are determined by surface tractions, resolved from the applied far-field stress state. A non-linear elliptical slip distribution is also applied with greatest slip at the center and tapering to zero at the fault tips. Slip magnitude is scaled by trial and error to keep tensile perturbations below typical fracture propagation thresholds (~10 MPa).

Figure 6A:
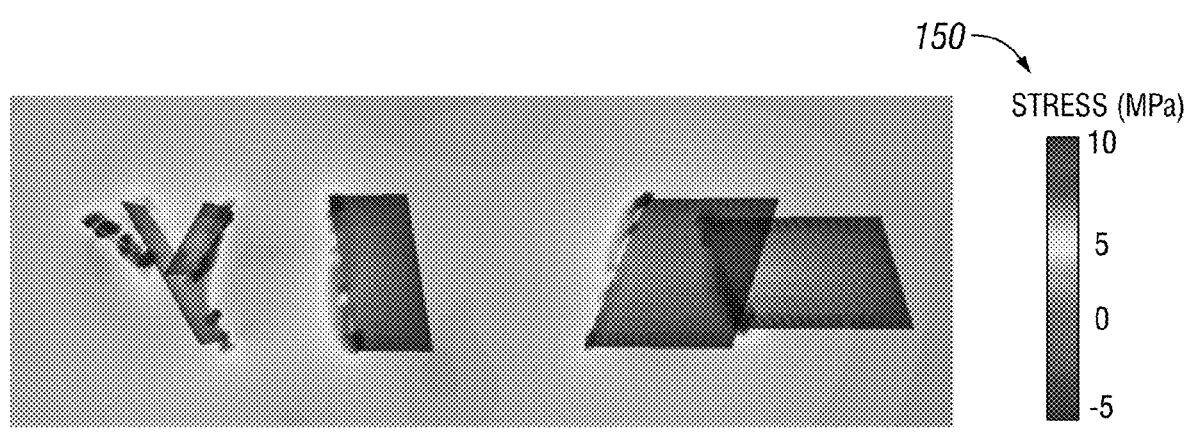
FIGS. 6A, 6B, and 6C are views example stress perturbations introduced according to the present disclosure into the stress perturbation model of FIG. 6.
Figure 6B:
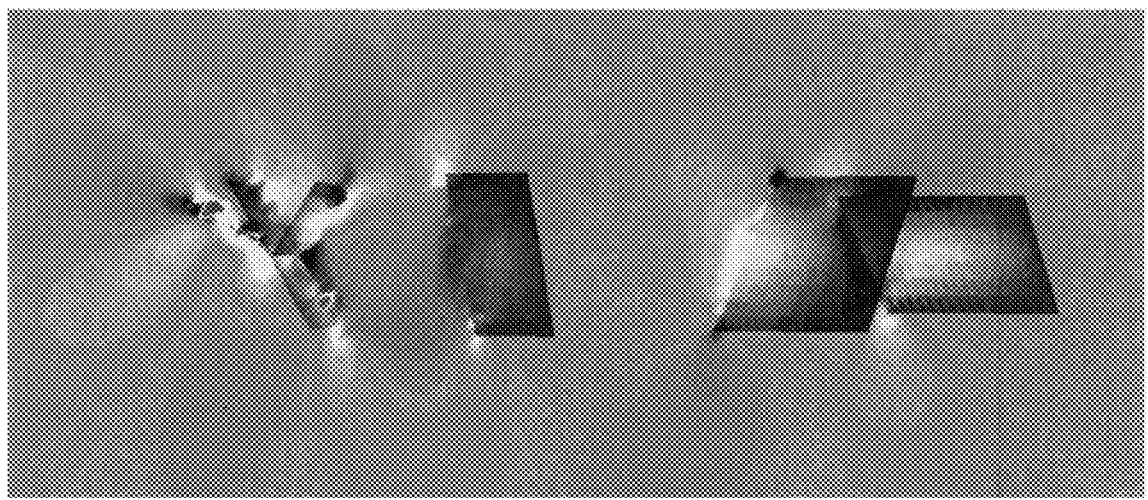
Figure 6C:
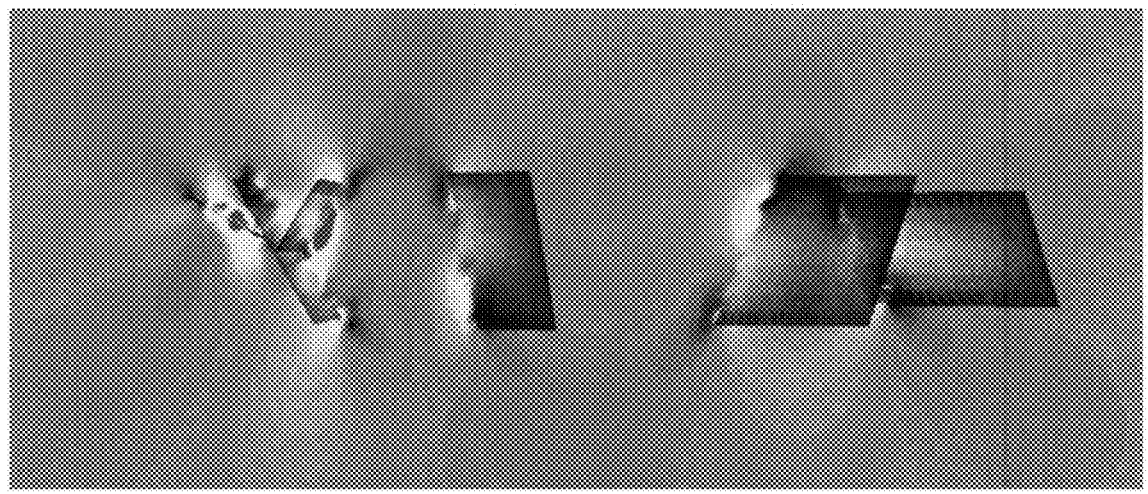

FIG. 6A is a diagram of an example horizontal stress perturbation $\Delta\sigma_3$ according to the present disclosure with an accompanying quantification color key 150 indicating the magnitude of the stress perturbation in Megapascals (MPa). FIG. 6B is a diagram of an example vertical stress perturbation $\Delta\sigma_{zz}$. FIG. 6C is a diagram of an example stress perturbation $\Delta\sigma_{yz}$. The magnitude of the example vertical stress perturbation $\Delta\sigma_{zz}$ and the example stress perturbation $\Delta\sigma_{yz}$ are also according to values indicated by color key 150.

It should be understood that a stress perturbation introduced during step 56 may be either a change in stress magnitude or orientation. Stress magnitude could be an increase in any of the nine stress components of the stress tensor, resulting in over increase in compression or tension, change in shear stress, or rotation of stresses. When faults are to be located outside of the background grid, the perturbation caused by the structures may transmit into the grid. Similarly, smaller perturbing structures within the background grid extents may cause stress heterogeneity on a more local scale.

Stress perturbations can be computed according to various methods. In some embodiments, a method of this disclosure is the triangular dislocation element method because it is numerically stable, is very flexible for many fault and horizon geometries, and is computationally much faster than finite element, discrete element, or other volumetric methods. Discrete fault stress solutions using the finite element method require faults to be computed using contacting fault surfaces, and are subject to numerical instabilities from meshing. Continuum fault stress solutions with the finite element method replace the discrete fault surfaces with mathematically equivalent zones. Continuum approaches require advanced constitutive models that also require significantly more computational power to solve.

It is not necessary for the perturbation stress grid to be at the same resolution or of the same geometry as the background stress grid. For example, the stress perturbation model may only cover a portion of the background stress model depending on the extent of faulting, or the effects of the perturbation may not cross into the whole background stress domain.

3D Total Stress Grid

During step 58, a measure of total stress in the gridded model is determined by addition of the stress values formed during the generation of the elastic dislocation model of discrete stress perturbation for faults during step 56 and the elastic background stress solution for the stress tensors in the cells of the gridded model formed during step 54.

According to the present disclosure, the principle of superposition is applied during step 58 to add the elastic perturbation stress (elastic dislocation model) to the elastic background stress (finite element model). So far as is known, previous methods focused on modeling the SRV at its own scale. The present disclosure integrates geomechanical effects from multiple geologic scales. The geomechanical concept is based on elastic superposition.

For an elastic solution the total stress (or equivalently total strain) is given by adding the background stress and the perturbation stress:

$$\sigma_{Total} = \sigma_{Background} + \sigma_{Perturbation}$$

$$\varepsilon_{Total} = \varepsilon_{Background} + \varepsilon_{Perturbation}$$

where the total stress or strain components ($\sigma_{ij}$ or $\varepsilon_{ij}$) are elastic tensor quantities.

Figure 7:
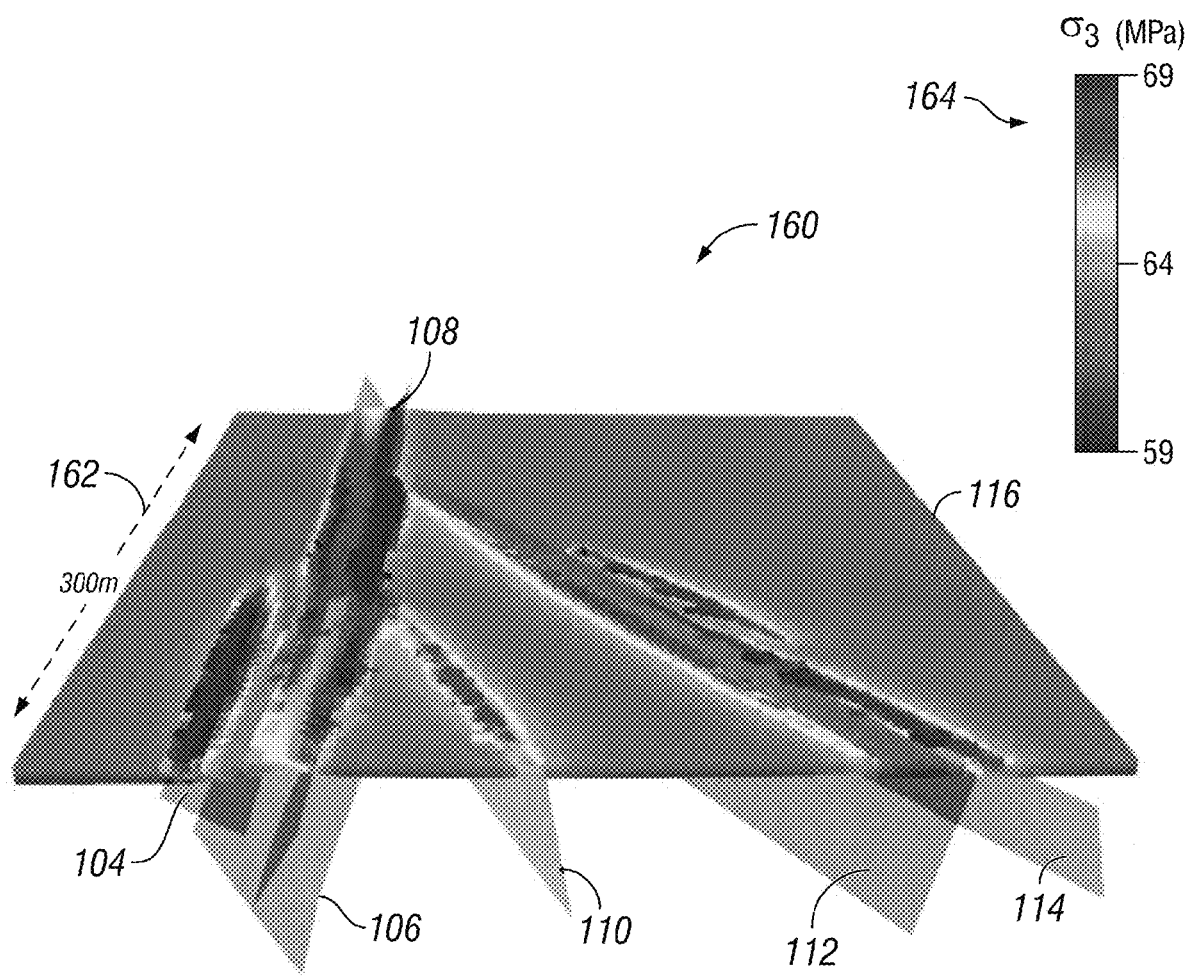
FIGS. 7 and 8 are perspective views of a computerized model of a 3-dimensional total stress grid formed according to the present disclosure for the region of interest of FIG. 1.

FIG. 7 is an image 160 of a 3-D display of total horizontal stress $\sigma_3$ in the gridded background geomechanical model M determined during step 58. As indicated at 162 the display in image 160 is at a seismic scale in the hundreds of meters, which is a much smaller scale than scale of the model M. A quantifying color key 164 indicates values of background stress $\sigma_3$ in Megapascals.

Figure 8:
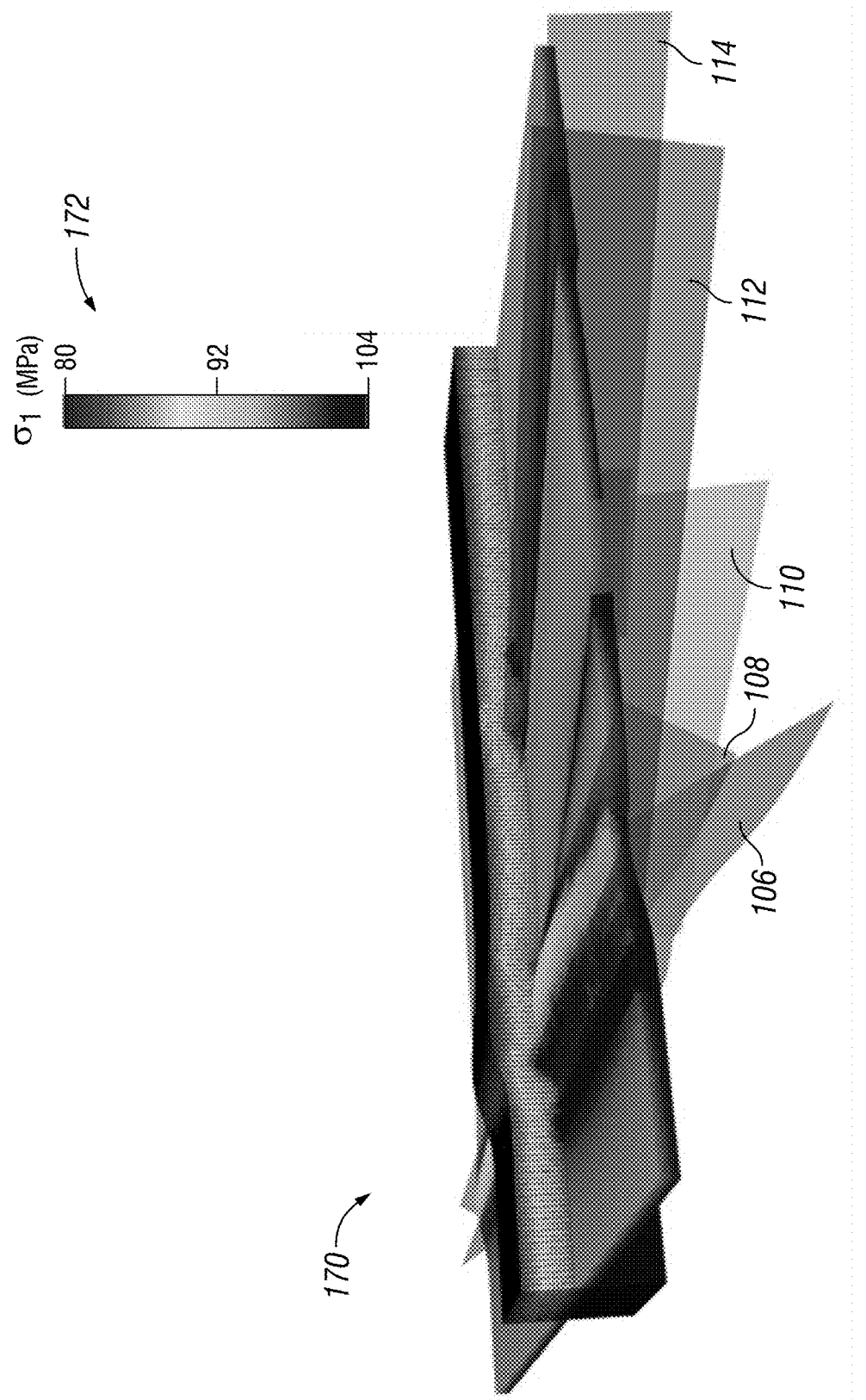

FIG. 8 is an image 170 of a 3-D display of total vertical stress $\sigma_1$ in the gridded background geomechanical model M determined during step 58. A quantifying color key 172 indicates values of total vertical stress $\sigma_1$ in Megapascals.

Superposition allows for background stress and perturbation stress to be solved independently in separate sub-models in forming in the 3-D total stress grid during step 58. The scale and resolution required for the background stress model and for the perturbation stress model is based on the scale of geologic features defining the stress perturbation (namely, faults and folds), the geometry of the layering is over an area much larger than the wellbore region defining the background stress. The stress perturbation model is also a much larger scale than the desired solution resolution of the SRV geomechanical model to being formed, namely, the volume containing hydraulic fractures.

Total stress is summed within the geocellular grid. Because the elastic dislocation model formed during step 56 assumes an elastic half space, layering effects are ignored at this larger scale. A basic approach is to reuse the background stress geocellular model as the basis for the total stress model. Depending on the desired resolution and smoothness of the total stress model, a new grid can be generated.

There are several techniques which may be used for mapping and accurate transfer of stress perturbation results onto the background grid model. Some examples of stress mapping methods are: simple averaging of data points within each grid cell, averaging of n closest points (nearest neighbor) to the grid cell centroid, as well as more complex geocellular statistical techniques such as multipoint statistics, or Kriging. Also, more advanced artificial intelligence or machine learning techniques such as Bayesian approaches may be performed to automate and optimize the stress mapping process.

In order to preserve the three dimensional nature of the stresses, each component of the stress tensor ($\sigma_{xx}$, $\sigma_{xz}$, $\sigma_{zz}$) may be added individually rather than summing derivative stress products (like stress invariants). In some embodiments, individual addition of stress tensor components may be used. Alternatively, strain tensors can be added to compute total strain, which can then be converted to stress using the elastic constitutive definition.

As another alternative, the perturbation stress or strain can be mapped back onto the boundaries of the background stress model or mapped into the background model at the internal nodes. Then the perturbation becomes the criteria for initial conditions or load constraints of a subsequent finite element solution on the background stress model grid. This more rigorous approach allows the numerical scheme to recompute and balance all internal forces and reactions to ensure strain compatibility.

In addition, the perturbation stress or strain can be mapped back onto the boundaries of the background stress model or mapped into the background model at the internal nodes. Then the perturbation becomes the criteria for initial conditions or load constraints of a subsequent finite element solution on the background stress model grid. This more rigorous approach allows the numerical scheme to recompute and balance all internal forces and reactions to ensure strain compatibility.

With the present disclosure, it has been found that since the difference between the effects of two different but statically equivalent stress conditions or loads, namely background stress and stress perturbations, becomes very small at sufficiently large distances from load, it is possible to apply the principle of superposition of the loads. The present disclosure then utilizes superposition of the effect of the different scales stress conditions or loads based on what is known as the Saint-Venant's Principle of mechanical loading and superposition of stress conditions.

Although the larger and smaller grids are not the same resolution, applying internal stresses computed in the larger model as external boundary conditions on the smaller model according to Saint-Venant's Principle has been found to be adapted to use in connection with the present disclosure in geomechanical modeling of stimulated rock volume stress conditions at multiple scales.

In the finite element application, stresses applied or mapped to grid cell (or element) faces are redistributed as point loads during mesh discretization. In other words, so long as the discretized point loads acting on the boundaries of the smaller SRV grid are mapped from the actual far field (or larger stress grid) stress distributions, then the difference between the two meshes at the SRV model boundaries has been found not to affect the stress solution within the SRV grid, except for grid cells which are located very close to the model boundary.

Finite element modeling based on this principle can be referred to as termed "submodeling." For example, both of the previously mentioned FracMan® and ABAQUS modeling techniques have tools providing for submodeling. In the present examples, submodeling is performed in FracMan® by copying the stress results of the regional stress model onto the SRV grid, and then setting the stress boundary conditions on the SRV model as equal to the regional stress results.

3D Hydraulic Fracture Template

During step 60, a suitable number of stimulated rock volume models (or SRV's) are generated. Each SRV formed during step 60 represents a model of formation rock conditions for the stimulated rock volume around an injection well, such as the wells 130, 132 and 134.

Figure 10:
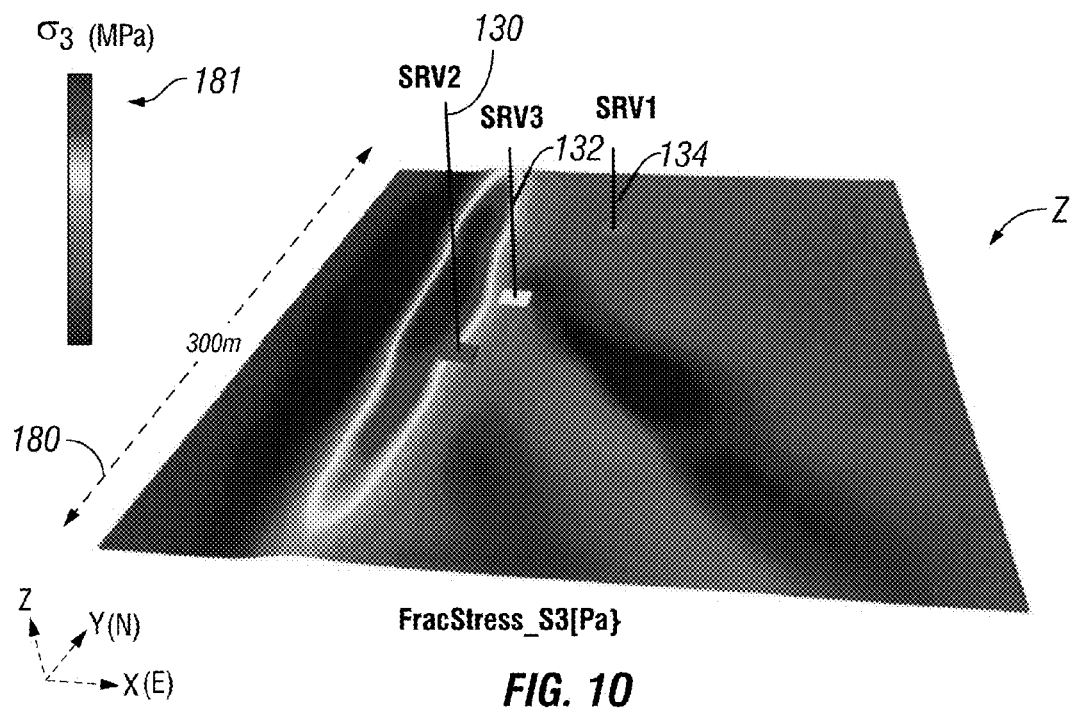
FIG. 10 is a perspective view illustrating relative locations of example stimulated reservoir volumes according to the present disclosure in the region of interest of FIG. 1.

FIG. 10 illustrates a display of horizontal stress $\sigma_3$ for an example 3-D computerized stimulated rock volume (SRV) model V formed during step 58 in accordance with the present disclosure around the location of a candidate injection well at one of the three locations of wells 130, 132 and 134: SRV1 at well 134, SRV2 at well 130, and SRV3 at well 132. The example stimulated rock volume model V in FIG. 10 is at a seismic scale of hundreds of meters as indicated by a scale indicator arrow 180. The magnitude of horizontal stress $\sigma_3$ in the display of FIG. 10 is indicated by a quantifying color key 181.

The stimulated rock volume model V formed during step 60 is based on seismic horizons, or horizons from multiple wells, or both to establish the upper and lower horizons. Depending on seismic resolution, intermediate seismic horizons may also be used. Well data from core and logs (gamma ray, resistivity, image logs, and other suitable logs) are provided to construct a detailed mechanical stratigraphy at the injection well at the 0.1 m to 1 m resolution. Geocellular and structural framework building techniques may be used to expand the wellbore mechanical stratigraphy and create continuous horizons over the three-dimensional extent of the SRV model V.

Figure 9:
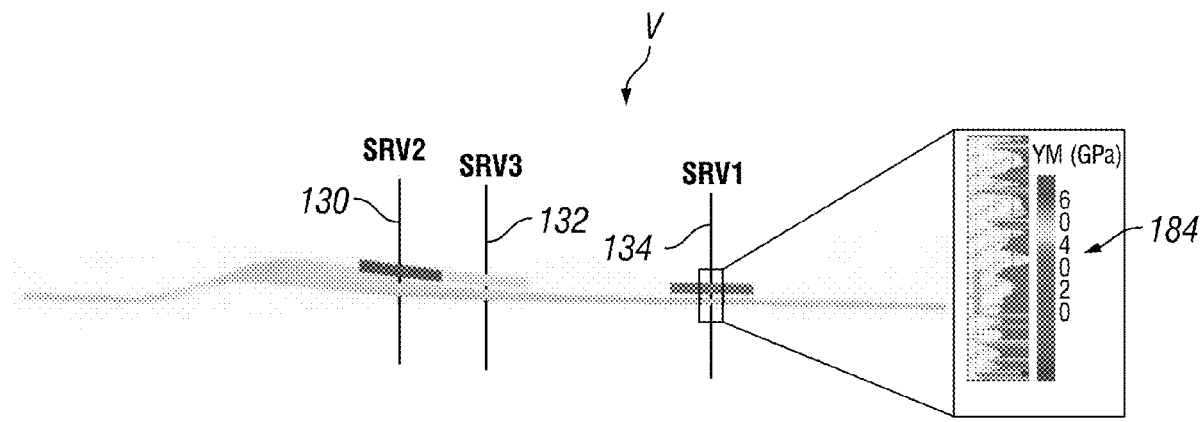
FIG. 9 is an isometric view of a computerized seismic scale hydraulic fracture model of a portion of the region of interest of FIG. 1 illustrating relative locations of example simulated reservoir volumes according to the present disclosure in the region of interest of FIG. 1.

FIG. 9 is a side elevation view of a portion of the stimulated rock volume model V with a display 182 of an example well log as a function of well depth in well 134 of the mechanical property of Young's modulus (YM) for the formation rock of stimulated rock volume SRV1. A calibration numerical key as indicated at 184 indicates units of measure of the displayed Young's modulus in units of Gigapascals (GPa).

Performance of SRV scale gridding to form stimulated reservoir volume models such as that shown as V in FIG. 10 can be implemented using a suitable one of the previously mentioned techniques such as Petrel, DSG, FracMan®, T7, MOVE, and GoCAD/SKUA for background structural modeling.

3D Hydraulic Fracture Results

During step 62, a suitable number of SRV stress sub-models stimulated reservoir models are generated using boundary conditions from the total stress grid formed during step 58. Each SRV stress sub-model formed during step 62 represents a model of formation rock conditions for a stimulated rock volume around an injection well, such as the wells 130, 132 and 134.

FIG. 11 is an example display 190 of stress distribution in the stimulated reservoir volume SRV1 formed according to the present disclosure during step 62. FIGS. 12 and 13 are similar example displays 190 and 192 formed during step 62 for stimulated reservoir volumes SRV2 and SRV3, respectively. The displays in FIGS. 11, 12 and 13 are of a single stimulation stage in a vertical well modeled during step 22 using, for example, the previously mentioned FracMan® processing. The FracMan® processing allows for three-dimensional hydraulic fracture propagation in a geocellular framework.

Propagation of hydraulic fractures during step 62 includes arbitrary fracture turning or change of direction of propagation in each of the three dimensions based on interaction with heterogeneous elastic grid cell properties and tensor-based stress states. Allowance is also made for leak-off into, and propagation from within, a complex tiered discrete fracture network (DFN).

In the SRV model illustrated in FIG. 10, hydraulic fracture model heterogeneity includes material properties and computed stress, $\sigma_{ij}$. Mechanical stratigraphy is assumed to be continuous in the model, except for minor random variability. Structural deformations were not large, and computed $S_{H_{max}}$ orientation was consistent across the model. However, structural position does affect the magnitude and distribution of normal and shear stresses.

In the modeling illustrated in FIGS. 11 through 13, injection occurred within a 6.1 m (20 foot) perforated interval designated at 196 in a middle-lower part of each SRV. An upper mechanical stratigraphic barrier is enforced to constrain upward growth. The injection treatment performed during the modeling of step 62 was simplified to a two-step injection profile with a 10 minute step with 150 cP (centipoise) fluid and no proppant and a 10 minute slurry step with 150 cP fluid composed of an average 1.8 ppg (pounds per gallon) concentration of 40/70 mesh ceramic proppant. Each SRV well was modeled during step 62 at a flow rate of 10 BPM (barrels per minute) assigned to the perforation interval to initiate a single fracture.

Figure 14:
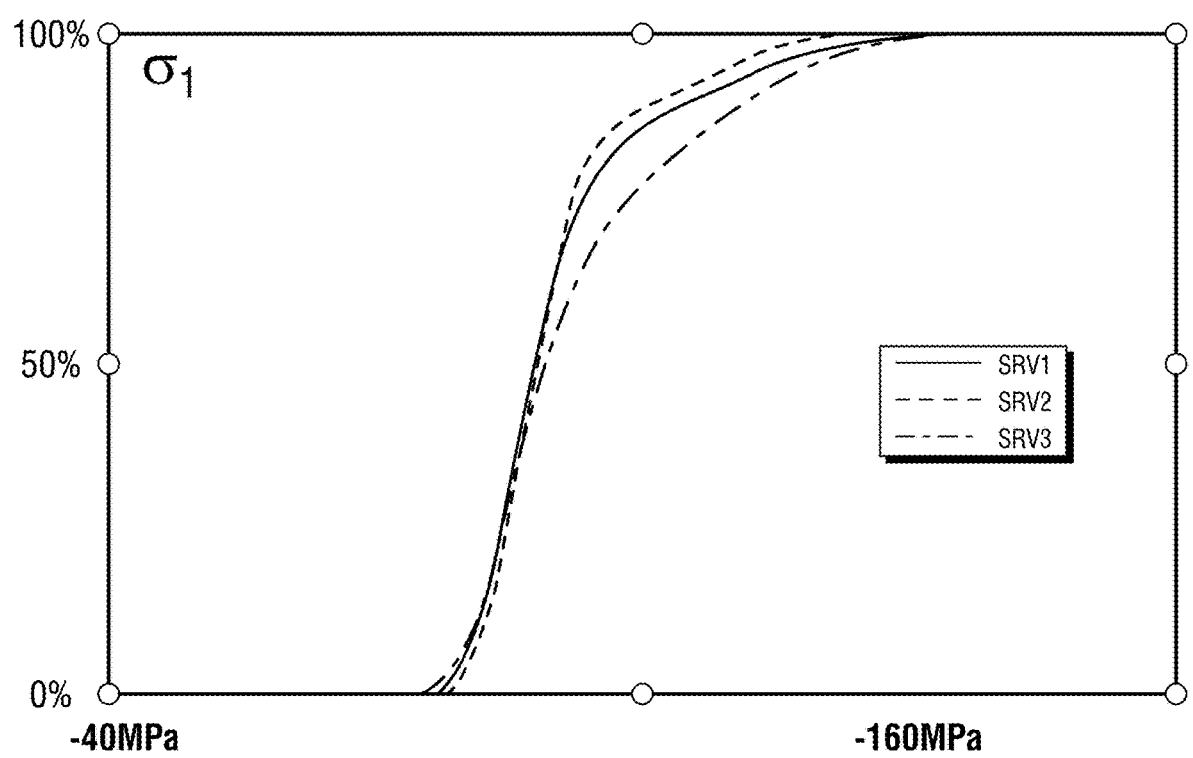
FIG. 14 is a display of grid cell vertical stress $\sigma_1$ distribution in the stress model of FIGS. 11-13.
Figure 15:
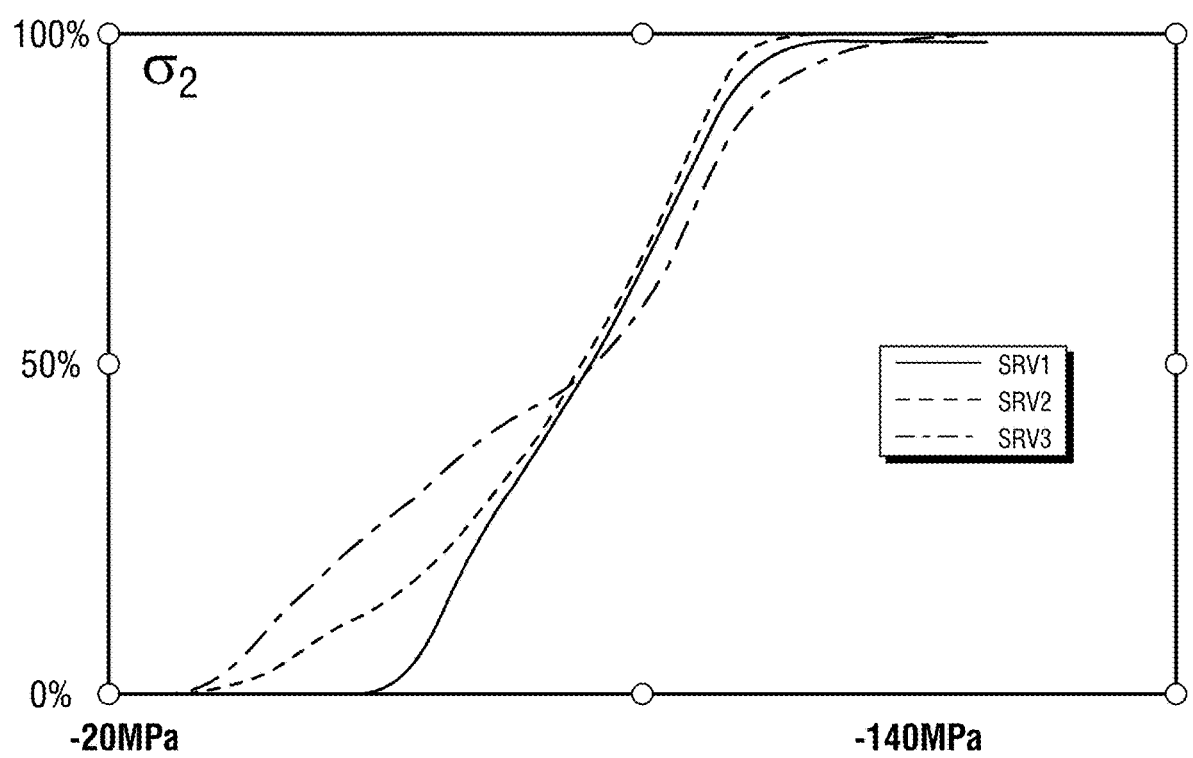
FIG. 15 is a display of grid cell horizontal stress $\sigma_2$ distribution in the stress model of FIGS. 11-13.
Figure 16:
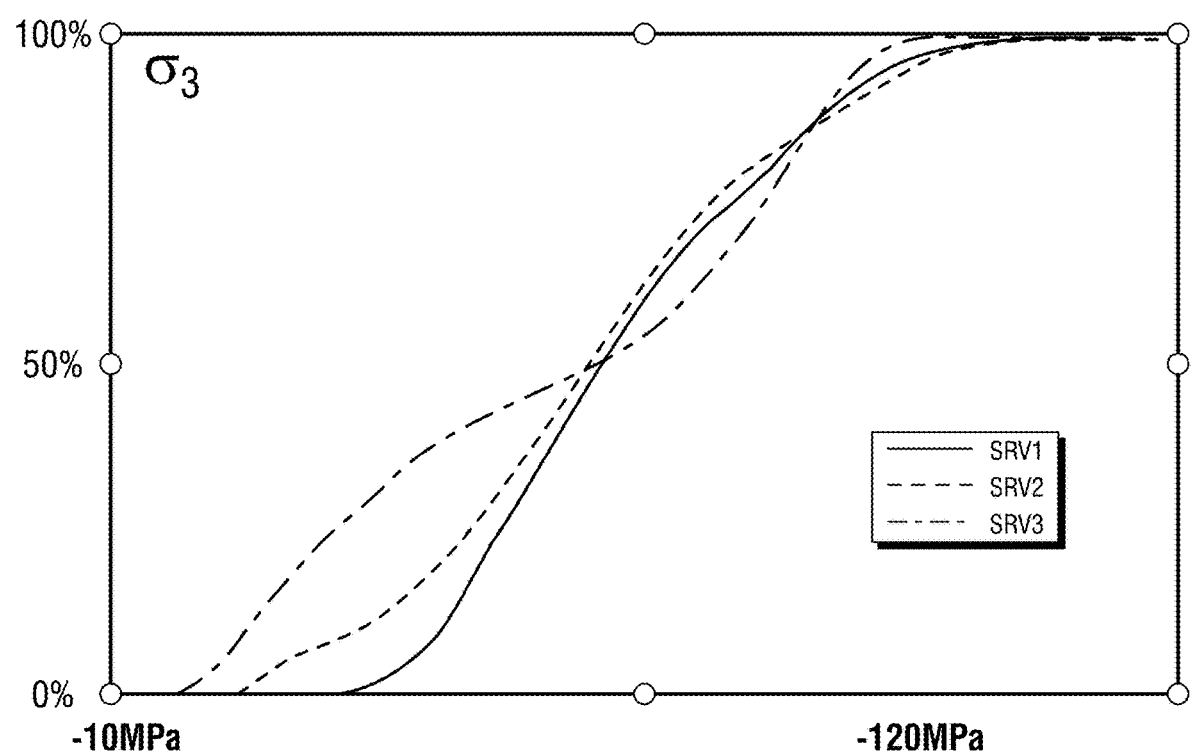
FIG. 16 is a display of grid cell horizontal stress $\sigma_3$ distribution in the stress model of FIGS. 11-13.

FIGS. 14, 15 and 16 are cumulative distribution function (CDF) comparative color plots for stimulated reservoir volumes SRV1, SRV2 and SRV3 of grid cell principal stress $\sigma_1$, $\sigma_2$ and $\sigma_3$, respectively. The CDF plots indicate that the geomechanical response for the different SRV models shown in FIGS. 11, 12, and 13 is greatly dependent on the geological position of each model as shown in FIG. 10.

3D Hydraulic Fracturing Template

Figure 17:
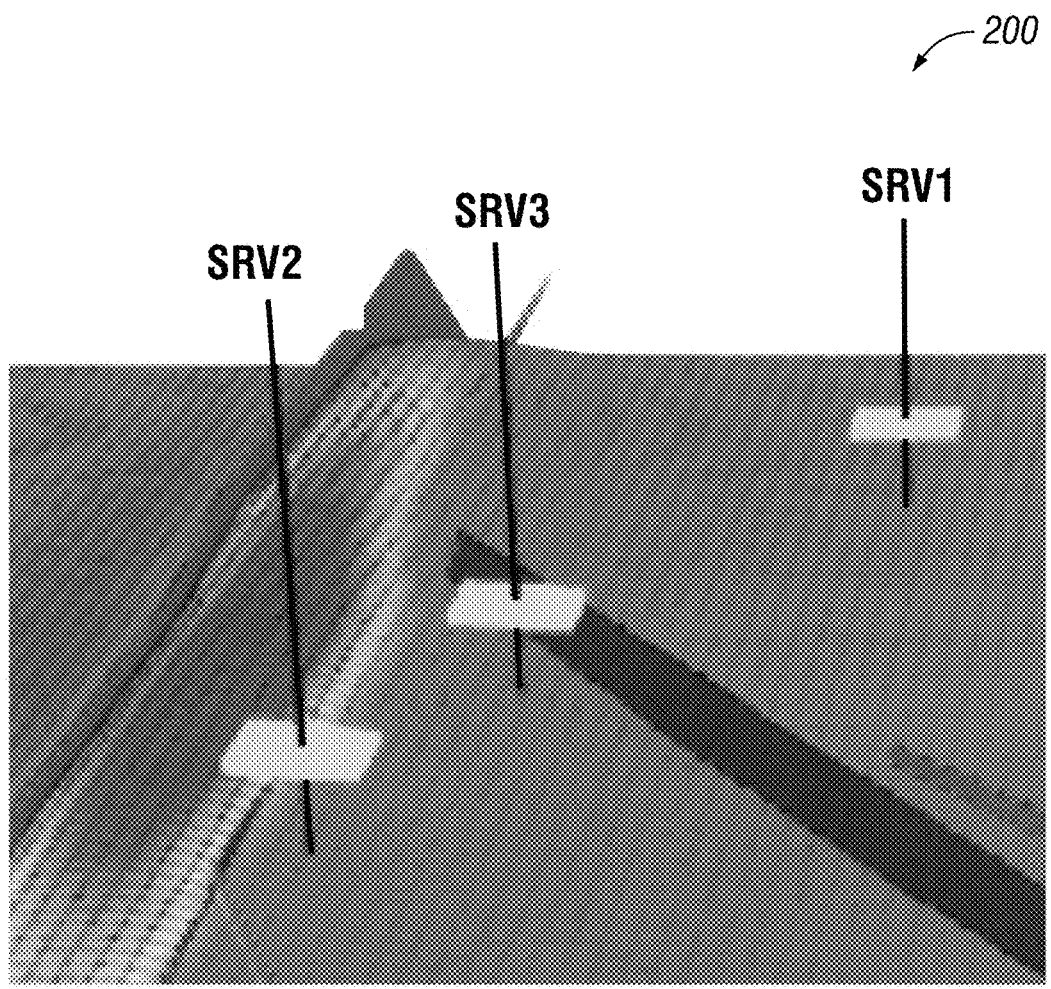
FIG. 17 is a perspective view of computerized stimulation stage in a vertical well modeled according to the present disclosure at an example location of the stimulated reservoir volumes for the region of interest of FIG. 1.
Figure 18A:
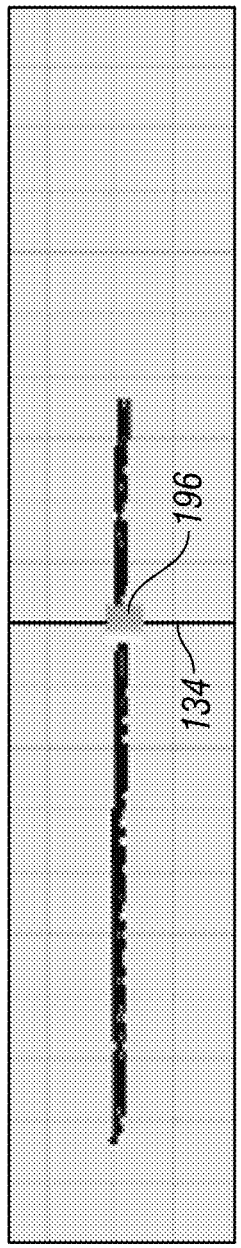
Figure 18B:
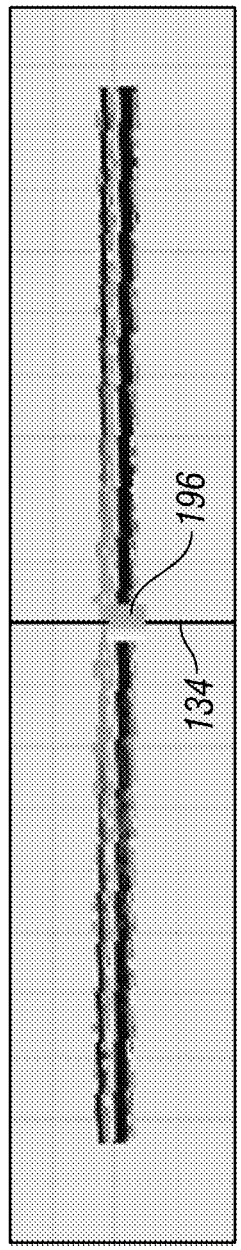
Figure 18C:
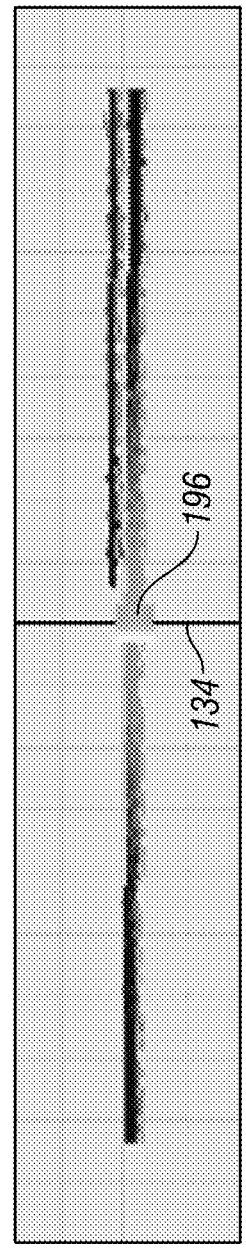
Figure 18D:
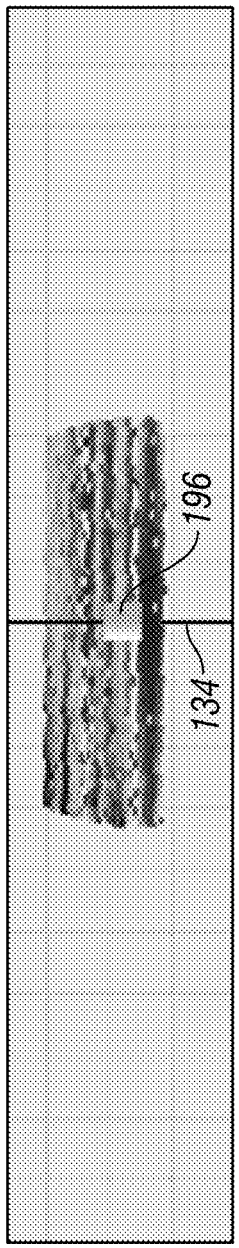
Figure 20A:
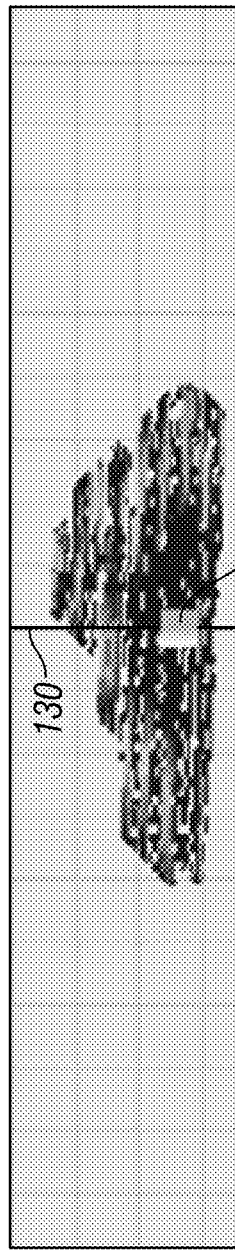
Figure 20B:
Figure 20C:
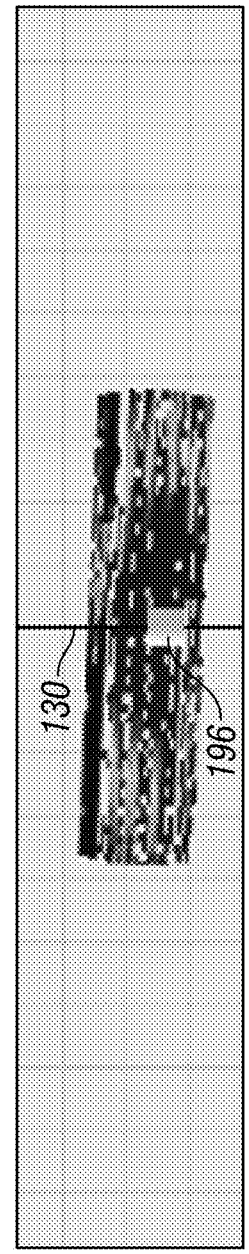
Figure 20D:
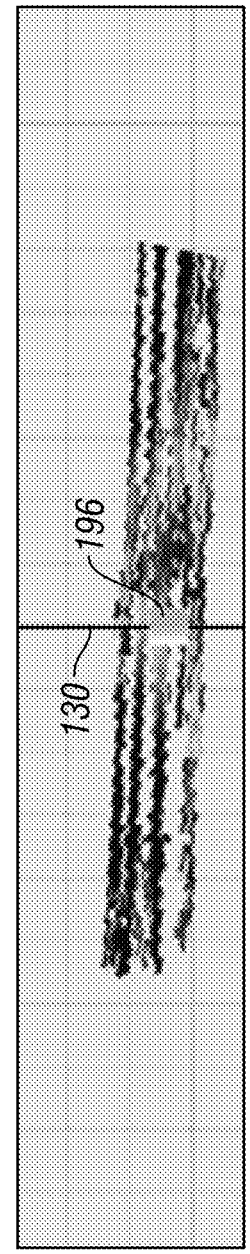
Figure 21:
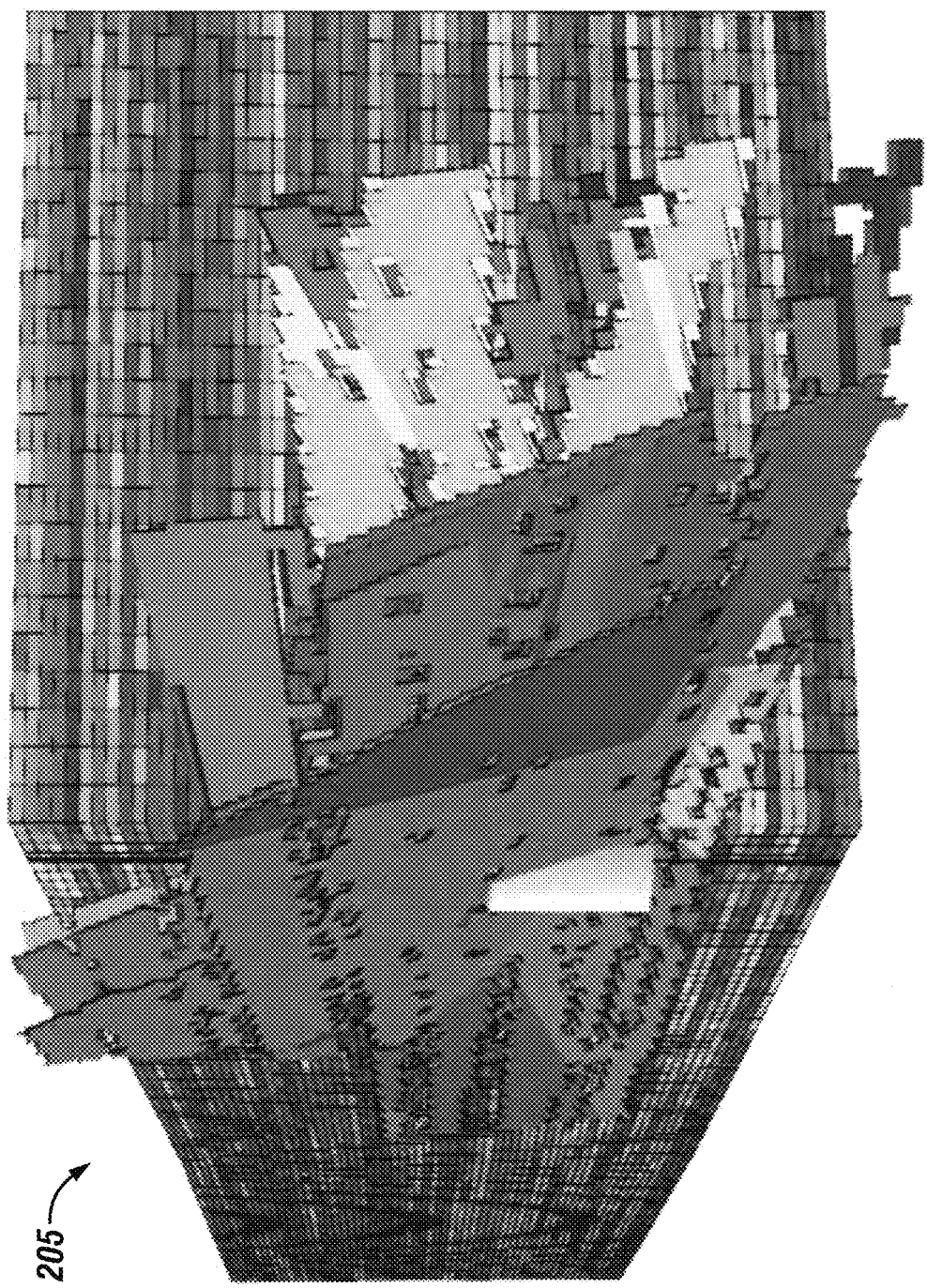
FIG. 21 is a computerized display of 3-dimensional distribution of composite stress and simulated hydraulic fractures in an example stimulated reservoir volume according to the present disclosure.

FIG. 17 is a display of an example computerized 3-D model 200 of the determined total stress formed during step 62 in the 3-D computerized stimulated rock volume (SRV) model of FIG. 10. The total stress represented in the model 200 in FIG. 17 includes the stress from the 3-D total stress grid model 160 shown in FIG. 7, and the stress from the stimulated reservoir volume V shown in FIG. 10. A single stimulation stage in a vertical well was modeled using the previously mentioned FracMan® techniques.

In forming the model 200 during step 62, three-dimensional stress is computed in the smaller SRV model of FIG. 10 using boundary conditions extracted from the regional total stress mode (FIG. 8).

Stress Result Analysis

During step 64, the SRV stress results are analyzed based on known geological and geo-mechanical criteria in the area of interest to ensure compatibility with the regional inputs. Stress magnitude and orientation should be consistent between the regional and SRV models and results should be consistent with geological knowledge for the area.

Figure 22:
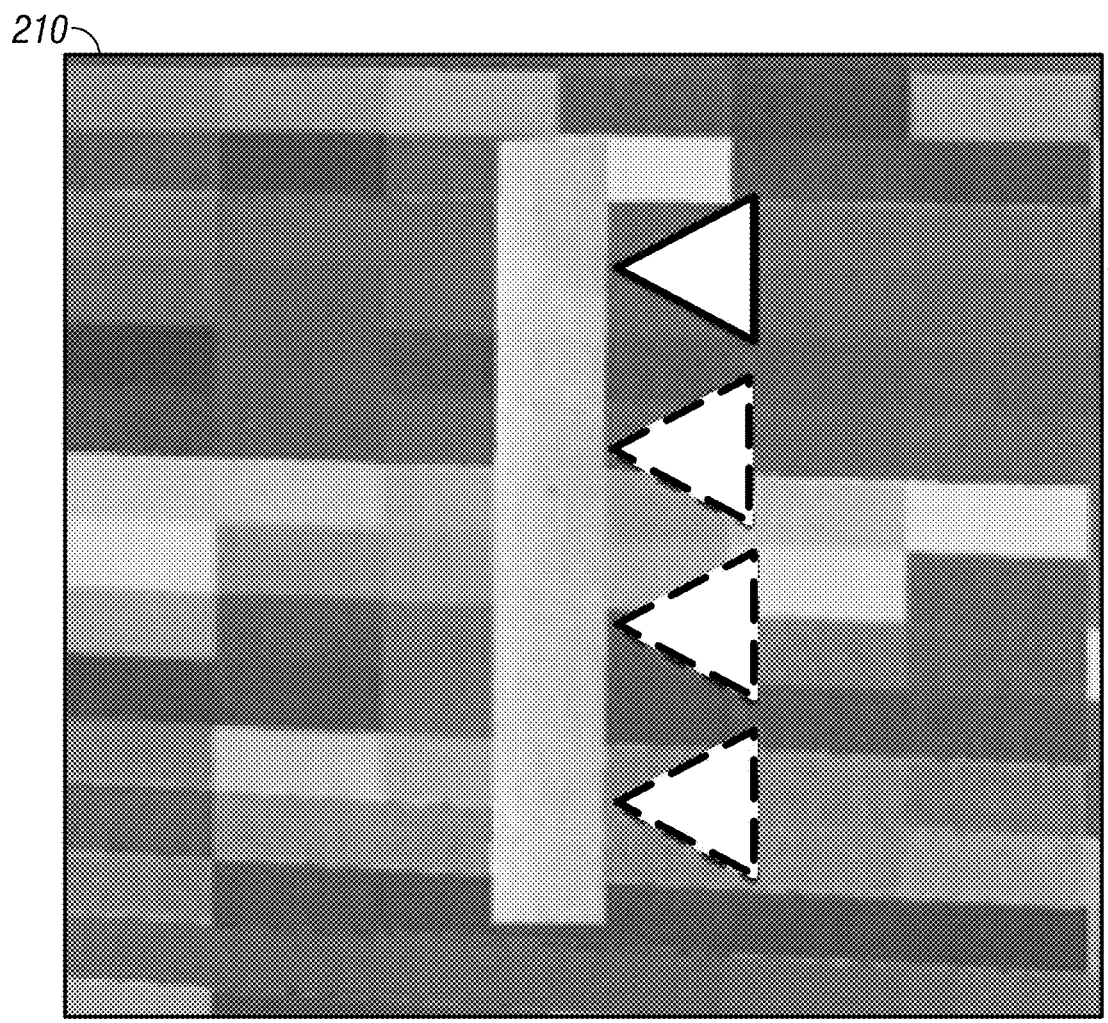
FIG. 22 is an enlarged view of a portion of the display of FIG. 10.
Figure 23:
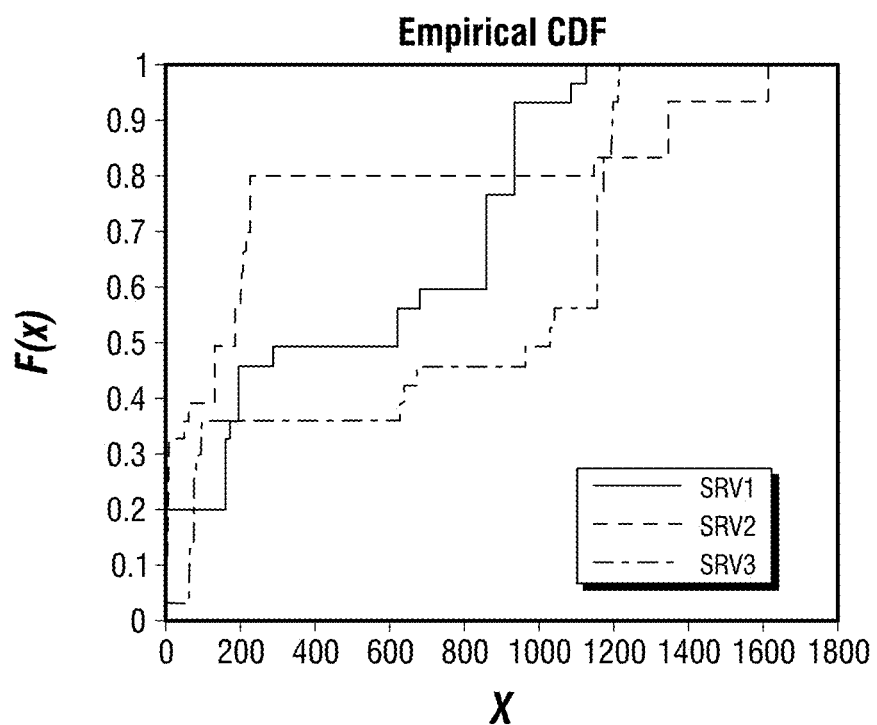
FIGS. 23 and 24 are displays of fracture surface area as a function of the location of a point of fracturing fluid injection in the stimulated reservoir volume of FIG. 10.
Figure 24:
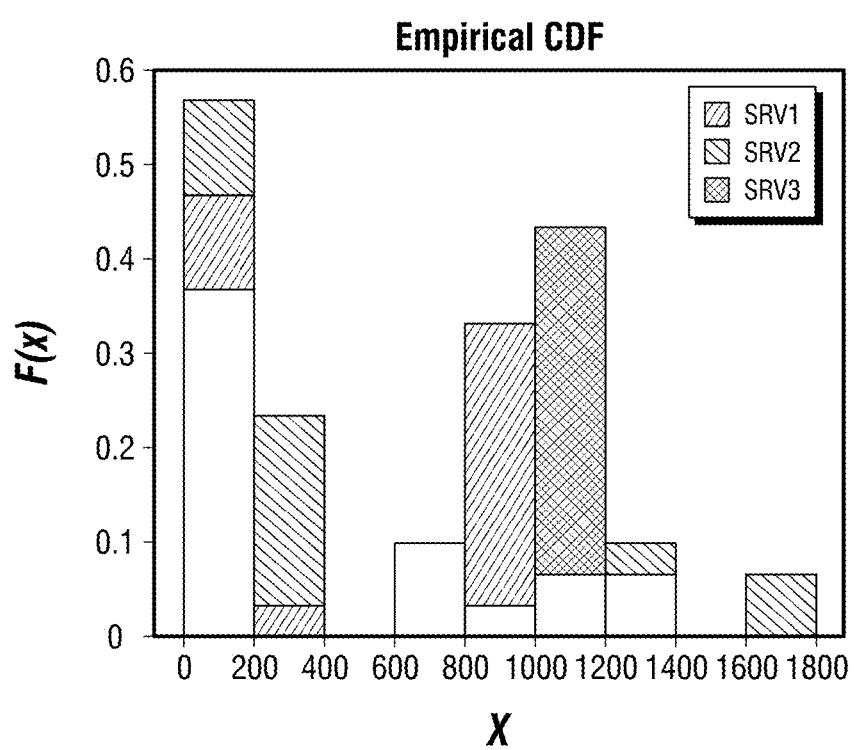

As an example of such an analysis during step 64, a suitable number of initiation points for randomly selected within a 6.1 m perforation window 210 as shown schematically in FIG. 22. To test the range of solutions, thirty independent hydraulic fractures were generated for each SRV case with a few example hydraulic fracture solutions shown in FIGS. 18-21. FIGS. 23 and 24 are displays of fracture surface area as a function of the location of a point of fracturing fluid injection in the stimulated reservoir volumes. It is evident from the displays in FIGS. 23 and 24 that despite common modeling input parameters, a minor variation regarding which sub-layer is to be injected with fracturing fluid significantly affects fracture dimensions. Further, some candidate initiation points resulted in stunted fracture growth.

During the analysis performed during step 64, the overall stress regime should be consistent with the far field model: normal faulting ($S_v > S_{Hmax} > S_{hmin}$), strike-slip faulting ($S_{Hmax} > S_v > S_{hmin}$), or reverse faulting regimes ($S_{Hmax} > S_{hmin} > S_v$). Also direction of any stress increases should be consistent: towards a fault, towards a fold, and upsection or downsection, and other accepted geological stress orientation criteria.

An error tolerance of 20% in average stress magnitude and orientation is recommended during step 64, otherwise the boundary conditions and all other mechanical properties should be checked for consistency and the stress model rerun.

If sub-layers in the SRV scale model have extreme property variations, it may however be possible for some layers to exceed the 20% error tolerance. For example, a stiff limestone bed embedded between compliant shale beds may exhibit stress reversal or extreme shear stresses. In this case geologic intuition should be invoked as to whether the stress result is consistent with known stress data from the field. In some cases extreme deviations may indicate additional mechanical processes are involved such as inter-layer shear slip or achieving an inelastic strength threshold (namely, inducing natural fractures or faults).

Further Model Activities and Fracturing Operations

The three different SRV locations SRV1, SRV2, and SRV3 within the regional 3D structural framework were tested by computer simulated 3-D hydraulic fracture simulation. The results are indicated for SRV1 in FIG. 18 and for SRV2 and SRV3 in FIGS. 19 and 20, FIGS. 18, 19 and 20 are each a collection of displays of stress conditions as a result of different example simulated 3-D hydraulic fractures in the respective SRV locations SRV1, SRV2 and SRV3. Respectively. Review of FIGS. 18, 19 and 20 reveals that the stimulated reservoir volume SRV1 which is modeled in FIG. 18 is most likely to have long fracture propagation with layer bounded height. The stimulated reservoir volume SRV2 which is modeled in FIG. 19 is most likely to have poor fracture initiation and limited length growth. The stimulated reservoir volume SRV3 which is modeled in FIG. 20 is most likely to have vertical fracture growth penetrating up section. This is reinforced by consideration of the display in FIG. 21 which has shown at 205 indicates that the SRV3 fractures have varying dip due to stress rotation in the layers.

After analysis of the SRV stress results against local geological knowledge during step 64, processing then proceeds to step 66. During step 66, the conditioned SRV geomechanical model formed according to the present disclosure to conduct further analyses common in the stimulated rock volume. Further, during step 66, after the additional analysis, hydraulic fracture operations and injection of pressurized fracturing fluid to fracture the formation at the selected location of interest in the chosen SRV is performed.

There are a number of further analytical and reservoir development activities contemplated within the present disclosure which can be performed during step 66. The following are representative examples.

3D hydraulic fracture simulation: The more robust mechanical conditions from the SRV model can be used as inputs for hydraulic fracture propagation models, such as those shown in FIGS. 18, 19 and 20 and described in preceding paragraphs. Example fracture propagation tools that will accept all or some of the new geologically conditioned SRV parameters are: FracMan® available as previously mentioned from Golder Associates; Mangrove available from Schlumberger Limited: ELFEN from Rockfield Global Technologies America LLC; or GOHFER from Halliburton Company. The workflow according to the present disclosure generates different structurally conditioned SRV models based on the same stratigraphy and far field tectonic stress conditions, and identical fracture injection parameters.

The results show that structural position affects hydraulic fracture length, height, orientation, and pressure distribution.

Microseismic synthesis: The structurally conditioned SRV models according to the present disclosure provide refined information on three dimensional stress and thus can be used to interpret the meaning of microseismic events, such as distribution, magnitude and growth patterns, and sequences.

Production simulation: The SRV models according to the present disclosure provide improved geometry and in situ stress parameters compared to prior log-based models. The improved geometry and in situ stress parameters can be used as inputs in reservoir production simulation to better predict flow units, depleting zones, or sweet spots.

Hydraulic fracture closure and proppant distribution: The SRV models according to the present disclosure provide more refined layer stress predictions and stress orientations. Fractures are known to dilate or close normal to the minimum principal stress. Thus, improved stress calculation according to the present disclosure leads to more accurate fracture closure predictions. Similarly, proppant distribution is known to be a function of fracture dilatancy normal to the minimum principal stress. Improved stress calculation in the SRV models according to the present disclosure provides for more accurate fracture proppant distribution predictions.

Velocity Models: Regional and local stress refinements can be used to improve seismic velocity models. In more porous intervals, or in fractured intervals, p-wave and s-wave velocity from seismic (and sonic) are known to vary with the level of stress. Geomechanical models at the regional and SRV scale that incorporate stress effects from structural controls can be used to derive more accurate velocity models.

Subsidence prediction: Reservoir depletion is known to create subsidence in the overburden which may be experienced at the surface. Improved geomechanical models at the regional and SRV scale that incorporate structural controls are expected to yield more accurate subsidence predictions.

From the foregoing, it can be appreciated that the present disclosure provides the formation of a geomechanically integrated stimulated rock volume model by combining multiple geomechanical models. The models so formed capture important and significant geomechanical effects at different geological scales, specifically capturing fault perturbations at the regional or seismic scale as well as layer stress at the hydraulic fracture simulation scale.

Data Processing System D

Figure 25:
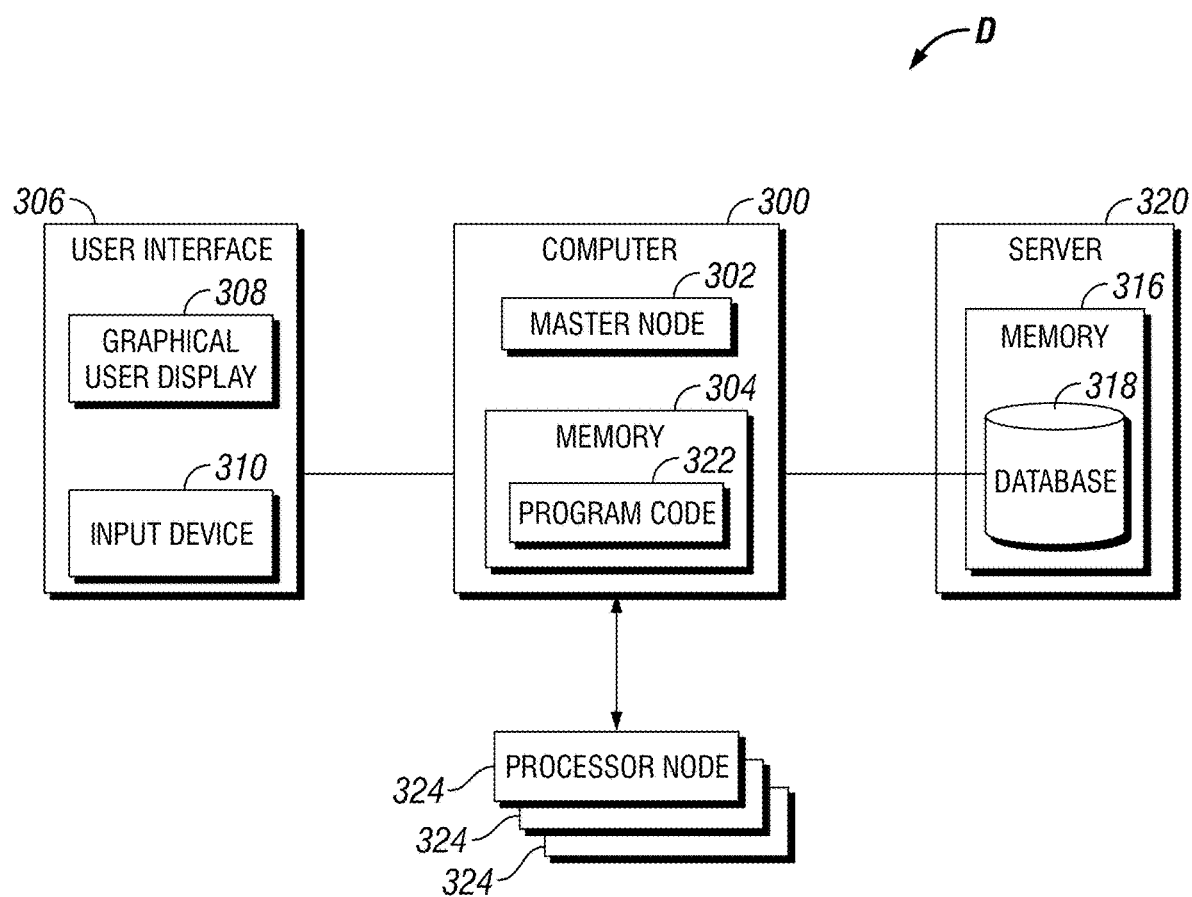
FIG. 25 is a schematic diagram of a data processing system for geomechanical modeling of stimulated rock volume stress conditions at multiple scales according to the present disclosure.

As illustrated in FIG. 25, the data processing system D includes a computer 300 having a master node processor 302 and memory 304 coupled to the processor 302 to store operating instructions, control information and database records therein. The data processing system D may be a multicore processor with nodes such as those from Intel Corporation or Advanced Micro Devices (AMD), or an HPC Linux cluster computer. The data processing system D may also be a mainframe computer of any conventional type of suitable processing capacity such as those available from International Business Machines (IBM) of Armonk, N.Y. or other source. The data processing system D may in cases also be a computer of any conventional type of suitable processing capacity, such as a personal computer, laptop computer, or any other suitable processing apparatus. It should thus be understood that a number of commercially available data processing systems and types of computers may be used for this purpose.

The computer 300 is accessible to operators or users through user interface 306 and are available for displaying output data or records of processing results obtained according to the present disclosure with an output graphic user display 308. The output display 308 includes components such as a printer and an output display screen capable of providing printed output information or visible displays in the form of graphs, data sheets, graphical images, data plots and the like as output records or images.

The user interface 306 of computer 300 also includes a suitable user input device or input/output control unit 310 to provide a user access to control or access information and database records and operate the computer 300. Data processing system D further includes a database of data stored in computer memory, which may be internal memory 304, or an external, networked, or non-networked memory as indicated at 316 in an associated database 318 in a server 320.

The data processing system D includes program code 322 stored in non-transitory memory 304 of the computer 300. The program code 322 according to the present disclosure is in the form of computer operable instructions causing the master node processor 302 to perform geomechanical modeling of stimulated rock volume at multiple scales according to the present disclosure in the manner set forth.

It should be noted that program code 322 may be in the form of microcode, programs, routines, or symbolic computer operable languages capable of providing a specific set of ordered operations controlling the functioning of the data processing system D and direct its operation. The instructions of program code 322 may be stored in memory 304 of the data processing system D, or on computer diskette, magnetic tape, conventional hard disk drive, electronic read-only memory, optical storage device, or other appropriate data storage device having a computer usable non-transitory medium stored thereon. Program code 322 may also be contained on a data storage device such as server 320 as a non-transitory computer readable medium, as shown.

The data processing system D may include a single CPU, or a computer cluster as shown in FIG. 25, including computer memory and other hardware to make it possible to manipulate data and obtain output data from input data. A cluster is a collection of computers, referred to as nodes, connected via a network. Usually a cluster has one or two head nodes or master nodes 302 used to synchronize the activities of the other nodes, referred to as processor nodes 324. The processor nodes 324 each execute the same computer program and work independently on different segments of the grid which represents the reservoir.

It can thus be appreciated that the present disclosure performs not only superposition of fault perturbation stresses, but also integration of the resultant total stress with a geocellular-type three-dimensional stress field at a regional scale and also a local SRV scale with detailed mechanical stratigraphy.

In contrast to the prior art, the present disclosure also determines measures of background stress and the perturbation stress independently. The present disclosure thus allows for multiple independent models with their own representative scale, and with unique grid resolution best suited for each geomechanical effect.

From the foregoing, it can be seen that the present disclosure provides a methodology to indicate the effect of the role of structural controls on a stimulated reservoir volume during in reservoir production planning. This capability has not so far as is known been provided in traditional hydraulic fracturing stimulation models.

The disclosure has been sufficiently described so that a person with average knowledge in the field of reservoir modeling and simulation may reproduce and obtain the results mentioned herein described for the disclosure. Nonetheless, any skilled person in the field of technique, subject of the disclosure herein, may carry out modifications not described in the request herein, to apply these modifications to a determined structure and methodology, or in the use and practice thereof, requires the claimed matter in the following claims; such structures and processes shall be covered within the scope of the disclosure.

It should be noted and understood that there can be improvements and modifications made of the present disclosure described in detail above without departing from the spirit or scope of the disclosure as set forth in the accompanying claims.

What is claimed is:

1. A method of forming a model of stress conditions in a stimulated reservoir volume in a region of interest of a subsurface reservoir formation for propagation of hydraulic fractures from an injection well in the region of interest of a subsurface reservoir for production of hydrocarbons from the subsurface reservoir, the method comprising the steps of:
   providing mechanical properties and boundary conditions data of the subsurface reservoir to a data processing system;
   processing the provided mechanical properties and boundary conditions data in the data processing system to form the model of stress conditions in the stimulated reservoir volume of the region of interest, the processing comprising:
   forming a background geomechanical model of the region of interest, the background geomechanical model comprising a three dimensional grid of cells representing mechanical properties and boundary conditions over the extent of the region of interest in the subsurface reservoir formation, the background geomechanical model comprising stratigraphic layers, a perforated well, the mechanical properties, structural discontinuities, and a three dimensional state of stress defined in terms of a Cauchy stress tensor;
   determining stress tensors for the individual grid cells of the formed background geomechanical model of the region of interest;
   forming a stress perturbation model of the region of interest, the stress perturbation model comprising a plurality of faults and a plurality of folds that contribute to a stress pattern for a candidate location of the stimulated reservoir volume in the region of interest, wherein forming the stress perturbation model of the region of interest comprises determining a 3D stress perturbation of the stress perturbation model using elastic dislocation, the elastic dislocation comprising assigning each of the plurality of faults a dislocation, wherein the formed background geomechanical model is formed at a first geologic scale of 100 meters (m) to 100 kilometers (km), and the formed stress perturbation model is formed at a second geologic scale of 0.1 m to 1 m;
   determining, using the formed stress perturbation model and a stress grid of the formed background geomechanical model, a measure of total stress at the candidate location for the stimulated reservoir volume in the region of interest, wherein determining, using the formed stress perturbation model and the stress grid of the formed background geomechanical model, a measure of total stress at the candidate location for the stimulated reservoir volume in the region of interest comprises using elastic superposition to combine perturbation stress from the formed stress perturbation model to the stress grid of the formed background geomechanical model, the elastic superposition comprising mapping the perturbation stress back onto the boundaries of the stress grid of the formed background geomechanical model;
   forming a model of stimulated rock volume around the injection well for candidate location for the stimulated rock volume; and
   determining three-dimensional stress conditions in a selected location for the stimulated rock volume model using the measure of total stress.

2. The method of claim 1, further comprising performing hydraulic fracturing of the stimulated reservoir volume for propagation of hydraulic fractures from the injection well for production of hydrocarbons from the subsurface reservoir.

3. The method of claim 1, further comprising forming an output image of the determined three-dimensional stress conditions in the formed stimulated rock volume model.

4. The method of claim 1, further comprising storing in the data processing system the determined three-dimensional stress conditions in the formed stimulated rock volume model.

5. The method of claim 1, wherein the measure of total stress comprises a three-dimensional stress grid.

6. A data storage device having stored in a non-transitory computer readable medium computer operable instructions for causing a data processing system to form a model of stress conditions in a stimulated reservoir volume in a region of interest of a subsurface reservoir formation for propagation of hydraulic fractures from an injection well in the region of interest of a subsurface reservoir for production of hydrocarbons from the subsurface reservoir, the instructions stored in the data storage device causing the data processing system to perform the following operations:
   forming a background geomechanical model of the region of interest, the background geomechanical model comprising a three dimensional grid of cells representing mechanical properties and boundary conditions of the subsurface reservoir over the extent of the region of interest in the subsurface reservoir formation, the background geomechanical model comprising stratigraphic layers, a perforated well, the mechanical properties, structural discontinuities, and a three dimensional state of stress defined in terms of a Cauchy stress tensor;
   determining stress tensors for the individual grid cells of the formed background geomechanical model of the region of interest;
   forming a stress perturbation model of the region of interest, the stress perturbation model comprising a plurality of faults and a plurality of folds that contribute to a stress pattern for a candidate location of the stimulated reservoir volume in the region of interest, wherein forming the stress perturbation model of the region of interest comprises determining a 3D stress perturbation of the stress perturbation model using elastic dislocation, the elastic dislocation comprising assigning each of the plurality of faults a dislocation, wherein the formed background geomechanical model is formed at a first geologic scale of 100 meters (m) to 100 kilometers (km), and the formed stress perturbation model is formed at a second geologic scale of 0.1 m to 1 m;

determining, using the formed stress perturbation model and a stress grid of the formed background geomechanical model, a measure of total stress at the candidate location for the stimulated reservoir volume in the region of interest, wherein determining, using the formed stress perturbation model and the stress grid of the formed background geomechanical model, a measure of total stress at the candidate location for the stimulated reservoir volume in the region of interest comprises using elastic superposition to combine perturbation stress from the formed stress perturbation model to the stress grid of the formed background geomechanical model, the elastic superposition comprising mapping the perturbation stress back onto the boundaries of the stress grid of the formed background geomechanical model;

forming a model of stimulated rock volume around the injection well for candidate location for the stimulated rock volume; and determining three-dimensional stress conditions in a selected location for the stimulated rock volume model using the measure of total stress.

7. The data storage device of claim 6, the operations further comprising forming an output image of the determined three-dimensional stress conditions in the formed stimulated rock volume model.

8. The data storage device of claim 6, the operations further comprising storing in the data processing system the determined three-dimensional stress conditions in the formed stimulated rock volume model.

9. The data storage device of claim 6, wherein the measure of total stress comprises a three-dimensional stress grid.

10. The data storage device of claim 6, comprising providing the three-dimensional stress conditions to a reservoir production simulation.

11. A data processing system for forming a model of stress conditions in a stimulated reservoir volume in a region of interest of a subsurface reservoir formation for propagation of hydraulic fractures from an injection well in the region of interest of a subsurface reservoir for production of hydrocarbons from the subsurface reservoir, comprising:

a processor; and a non-transitory memory having program code stored thereon, the program code comprising instructions that cause the processor to perform operations comprising:

forming a background geomechanical model of the region of interest, the background geomechanical model comprising a three dimensional grid of cells representing mechanical properties and boundary conditions of the subsurface reservoir over the extent of the region of interest in the subsurface reservoir formation, the background geomechanical model comprising stratigraphic layers, a perforated well, the mechanical properties, structural discontinuities, and a three dimensional state of stress defined in terms of a Cauchy stress tensor;

determining stress tensors for the individual grid cells of the formed background geomechanical model of the region of interest;

forming a stress perturbation model of the region of interest, the stress perturbation model comprising a plurality of faults and a plurality of folds that contribute to a stress pattern for a candidate location of the stimulated reservoir volume in the region of interest, wherein forming the stress perturbation model of the region of interest comprises determining a 3D stress perturbation of the stress perturbation model using elastic dislocation, the elastic dislocation comprising assigning each of the plurality of faults a dislocation, wherein the formed background geomechanical model is formed at a first geologic scale of 100 meters (m) to 100 kilometers (km), and the formed stress perturbation model is formed at a second geologic scale of 0.1 m to 1 m;

determining, using the formed stress perturbation model and a stress grid of the formed background geomechanical model, a measure of total stress at the candidate location for the stimulated reservoir volume in the region of interest, wherein determining, using the formed stress perturbation model and the stress grid of the formed background geomechanical model, a measure of total stress at the candidate location for the stimulated reservoir volume in the region of interest comprises using elastic superposition to combine perturbation stress from the formed stress perturbation model to the stress grid of the formed background geomechanical model, the elastic superposition comprising mapping the perturbation stress back onto the boundaries of the stress grid of the formed background geomechanical model;

forming a model of stimulated rock volume around the injection well for candidate location for the stimulated rock volume; and determining three-dimensional stress conditions in a selected location for the stimulated rock volume model using the measure of total stress.

12. The data processing system of claim 11, the operations further comprising forming an output image of the determined three-dimensional stress conditions in the formed stimulated rock volume model.

13. The data processing system of claim 11, the operations further comprising storing in the data processing system the determined three-dimensional stress conditions in the formed stimulated rock volume model.

14. The data processing system of claim 11, wherein the measure of total stress comprises a three-dimensional stress grid.

* * * * *